US008487335B2

(12) United States Patent
Fukuda

(10) Patent No.: US 8,487,335 B2
(45) Date of Patent: Jul. 16, 2013

(54) LIGHT EMITTING DEVICE, ILLUMINATION APPARATUS AND DISPLAY APPARATUS

(75) Inventor: Toshihiro Fukuda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/401,318

(22) Filed: Feb. 21, 2012

(65) Prior Publication Data

US 2012/0235183 A1    Sep. 20, 2012

(30) Foreign Application Priority Data

Mar. 17, 2011 (JP) .................................. 2011-059666

(51) Int. Cl.
| | |
|---|---|
| H01L 29/22 | (2006.01) |
| H01L 29/227 | (2006.01) |
| H01L 33/00 | (2010.01) |
| H01L 29/06 | (2006.01) |
| H01L 31/0328 | (2006.01) |
| H01L 31/0336 | (2006.01) |
| H01L 31/072 | (2012.01) |
| H01L 31/109 | (2006.01) |
| H01L 29/08 | (2006.01) |
| H01L 35/24 | (2006.01) |
| H01L 51/00 | (2006.01) |
| H01L 27/15 | (2006.01) |
| H01L 29/26 | (2006.01) |
| H01L 31/12 | (2006.01) |

(52) U.S. Cl.
USPC ................. 257/98; 257/13; 257/40; 257/79; 257/E33.001; 257/E33.013; 257/E33.068

(58) Field of Classification Search
USPC .......... 257/13, 40, 79, 98, E33.001, E33.013, 257/E33.068
See application file for complete search history.

(56) References Cited

U.S. PATENT DOCUMENTS

| | | | |
|---|---|---|---|
| 8,076,838 B2* | 12/2011 | Kobayashi | 313/504 |
| 8,357,930 B2* | 1/2013 | Ide et al. | 257/40 |
| 2004/0057115 A1* | 3/2004 | Yamazaki et al. | 359/577 |
| 2010/0084570 A1* | 4/2010 | Katagiri | 250/458.1 |

FOREIGN PATENT DOCUMENTS

| | | |
|---|---|---|
| JP | 2000-243573 | 9/2000 |
| JP | 2002-289358 | 10/2002 |
| JP | 3508741 | 3/2004 |
| JP | 2006-244713 | 9/2006 |
| WO | 01/39554 | 5/2001 |

* cited by examiner

Primary Examiner — Ida M Soward
(74) Attorney, Agent, or Firm — Sheridan Ross P.C.

(57) ABSTRACT

Disclosed herein is a light emitting device including: an organic layer sandwiched between a first electrode and a second electrode to serve as an organic layer including a light emitting layer for emitting monochromatic light at one location; a first light reflection boundary face provided on a side close to the first electrode to serve as a boundary face for reflecting light emitted from the light emitting layer so as to radiate the reflected light from a side close to the second electrode; and a second light reflection boundary face, a third light reflection boundary face and a fourth light reflection boundary face which are sequentially provided at positions separated away from each other in a direction from the first electrode to the second electrode on the side close to the second electrode.

20 Claims, 16 Drawing Sheets

F I G . 3
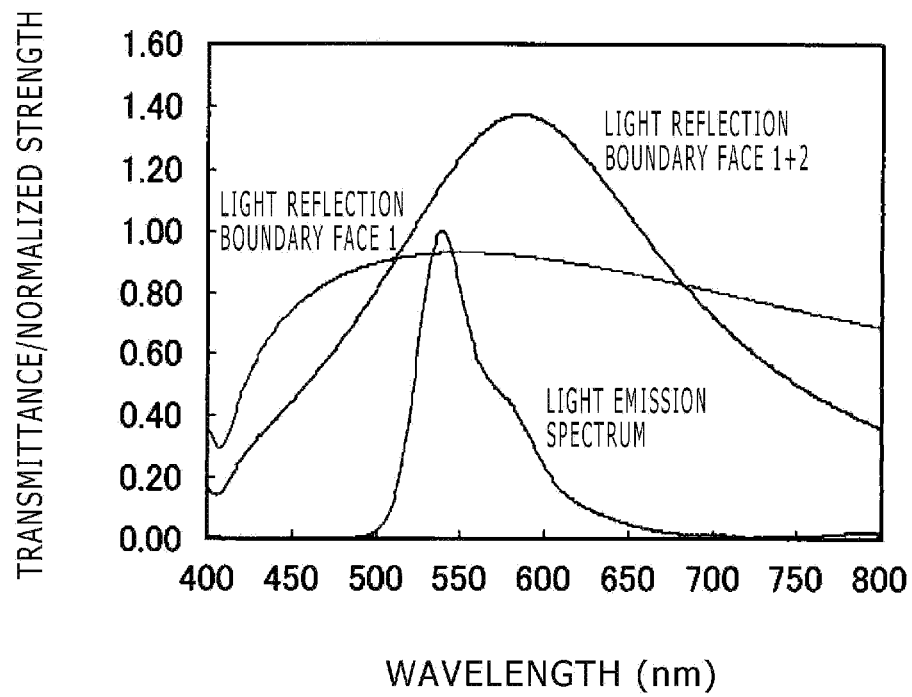

F I G . 5
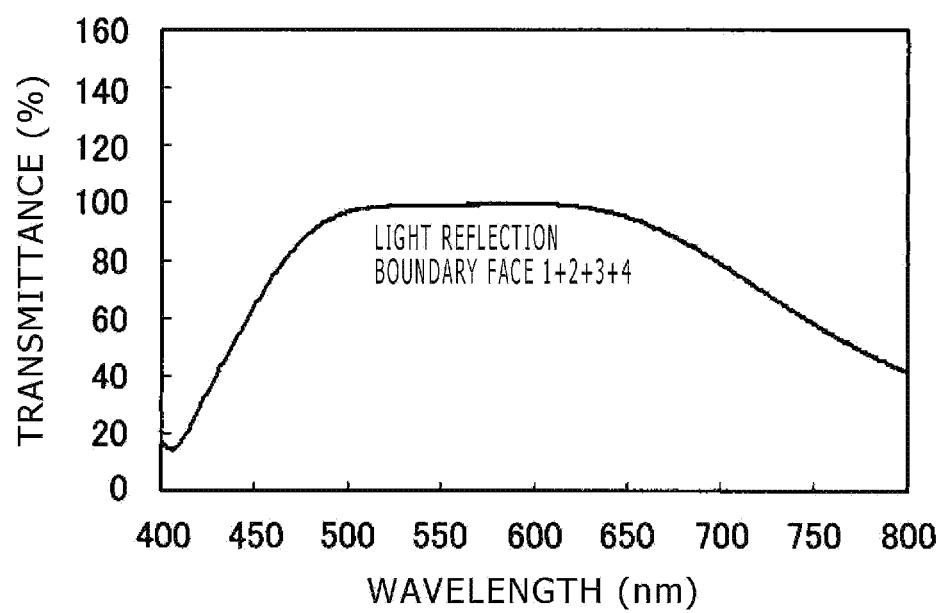

⇩ LIGHT

LIGHT EMITTING DEVICE, ILLUMINATION APPARATUS AND DISPLAY APPARATUS

CROSS REFERENCES TO RELATED APPLICATIONS

The present application claims priority to Japanese Priority Patent Application JP 2011-059666 filed in the Japan Patent Office on Mar. 17, 2011, the entire content of which is hereby incorporated by reference.

BACKGROUND

The present disclosure relates to a light emitting device, an illumination apparatus employing the light emitting device and a display apparatus also making use of the light emitting device. More particularly, the present technology relates to a light emitting device utilizing the electroluminescence of an organic material, an illumination apparatus employing the light emitting device and a display apparatus also making use of the light emitting device.

As a light emitting device capable of emitting light at high luminance when driven by a low DC (direct current) voltage, the light emitting device making use of the electroluminescence of an organic material draws much attention, and the research of such a light emitting device has been carried out extensively as well as intensively. In the following description, the light emitting device making use of the electroluminescence of an organic material is referred to as an organic EL device. The organic EL device has a structure in which an organic layer is sandwiched between a light reflection electrode and a light transmission electrode. The organic layer includes a light emitting layer generally having a thickness in a range of several tens of nm to several hundreds of nm. Light emitted by the light emitting layer of such an organic EL device experiences interferences in the device structure before being fetched by an external device. In the past, attempts have been made to improve the light emission efficiency of the organic EL device by utilizing such interferences.

There has been proposed a technology disclosed in Japanese Patent Laid-open No. 2002-289358. In accordance with this technology, interferences of light emanating from the light emitting layer in a direction toward the light transmission electrode and light emanating from the light emitting layer in a direction toward the light reflection electrode are used to improve the light emission efficiency by setting the distance from the light emission position to a light reflection layer at such a value that light having a light emission wavelength resonates. In this way, the light emission efficiency can be improved.

In accordance with a technology disclosed in Japanese Patent Laid-open No. 2000-243573, light reflection on a boundary face between a light transmission electrode and a substrate is also taken into consideration in prescribing two distances. The two distances are a distance from the light emission position to a light reflection electrode and a distance from the light emission position to the boundary face between the light transmission electrode and the substrate.

In accordance with a technology disclosed in PCT Patent Publication No. WO01/039554 pamphlet, interferences caused by multiple light reflections between the light transmission electrode and the light reflection electrode are used to improve the light emission efficiency by setting the thickness of a layer provided between the light transmission electrode and the light reflection electrode at such a value that light having a desired wavelength resonates.

In accordance with a technology disclosed in Japanese Patent No. 3508741, as a technique for improving the viewing-angle characteristic of the chromaticity point of the white color in a display apparatus constructed by combining light emitting devices each capable of raising the light emission efficiency by making use of a resonator structure, there has been proposed a method for controlling the balance of attenuations of three colors, that is, the R (red), G (green) and B (blue) colors, by adjusting the thickness of an organic layer.

In accordance with the technologies described above, however, in the organic EL device making use of interferences of emitted light in order to increase the light emission efficiency, if the bandwidth of an interference filter of fetched light h becomes narrow, the viewing-angle dependence of the light emission characteristic increases as evidenced by, among others, the fact that the wavelength of the light h is much shifted when seeing the light emitting surface from a point separated away in an inclined direction and the fact that the light emission strength deteriorates.

On the other hand, there has also been proposed a technology disclosed in Japanese Patent Laid-open No. 2006-244713. In accordance with this technology, interferences caused by the phase of light emitted by a light reflection layer of an organic light emitting device having a monochromatic spectrum with a narrow band and a single light reflection layer provided on the light emanation side are set so as to give a reverse phase for a center wavelength. In this way, color-phase changes caused by variations in viewing angle can be avoided. In this case, the number of light emission wavelengths of one device and the number of light reflection boundary faces are each limited to one so that it is possible to sustain the luminance of monochromatic light and the viewing-angle characteristic of the monochromatic light. However, there is no band which is broad enough for eliminating changes of the color phase. In addition, if an attempt is to be made to broaden this band, it is necessary to enhance the degree of mutual cancellation by raising the reflectance. In this case, however, the efficiency deteriorates considerably.

SUMMARY

In order to solve the problems described above, the present technology provides a light emitting device capable of emitting light that can be well fetched over a broad wavelength band and capable of substantially reducing the viewing-angle dependence of the luminance and the viewing-angle dependence of the color phase for monochromatic light.

In addition, in order to solve other problems of the related art, the present technology also provides an illumination apparatus which has little viewing-angle dependence, has a good light distribution characteristic and can be manufactured easily with a high degree of productivity.

On top of that, in order to solve further problems of the related art, the present technology also provides a display apparatus which is capable of displaying an image having little viewing-angle dependence and having a high quality and can be manufactured easily with a high degree of productivity.

In order to solve the problems described above, the present technology provides a light emitting device including:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face, a third light reflection boundary face and a fourth light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation L4 denoting an optical distance between the luminescence center and the fourth light reflection boundary face;

with notation $\lambda 1$ denoting the center wavelength of a light emission spectrum of the light emitting layer;

with notations n, m, m' and m" each denoting an integer;

with notations $\lambda 11$, $\lambda 12$, $\lambda 13$ and $\lambda 14$ each denoting an interference wavelength;

with the length unit nanometer taken as a unit of the wavelengths $\lambda 1$, $\lambda 11$, $\lambda 12$, $\lambda 13$ and $\lambda 14$;

with notation $\phi 1$ denoting a phase change observed when light having wavelengths is reflected by the first light reflection boundary face;

with notation $\phi 2$ denoting a phase change observed when light having wavelengths is reflected by the second light reflection boundary face;

with notation $\phi 3$ denoting a phase change observed when light having wavelengths is reflected by the third light reflection boundary face; and with notation $\phi 4$ denoting a phase change observed when light having wavelengths is reflected by the fourth light reflection boundary face, the optical distances L1, L2, L3 and L4 satisfy all Expressions (1) to (8) given as follows:

$$\text{where } n \geq 0, \ 2L1/\lambda 11 + \phi 1/2\pi = n \tag{1}$$

$$\lambda 1 - 150 < \lambda 11 < \lambda 1 + 80 \tag{2}$$

$$2L2/\lambda 12 + \phi 2/2\pi = m \tag{3}$$

$$2L3/\lambda 13 + \phi 3/2\pi = m' + 1/2 \tag{4}$$

$$2L4/\lambda 14 + \phi 4/2\pi = m'' + 1/2 \tag{5}$$

$$\lambda 1 - 80 < \lambda 12 < \lambda 1 + 80 \tag{6}$$

$$\lambda 1 - 150 < \lambda 13 < \lambda 1 + 150 \tag{7}$$

$$\lambda 1 - 150 < \lambda 14 < \lambda 1 + 150 \tag{8}$$

In addition, the present technology also provides an illumination apparatus employing a plurality of light emitting devices which are used for emitting light having plain colors different from each other and each include:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face, a third light reflection boundary face and a fourth light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation L4 denoting an optical distance between the luminescence center and the fourth light reflection boundary face;

with notation $\lambda 1$ denoting the center wavelength of a light emission spectrum of the light emitting layer;

with notations n, m, m' and m" each denoting an integer;

with notations $\lambda 11$, $\lambda 12$, $\lambda 13$ and $\lambda 14$ each denoting an interference wavelength;

with the length unit nanometer taken as a unit of the wavelengths $\lambda 1$, $\lambda 11$, $\lambda 12$, $\lambda 13$ and $\lambda 14$;

with notation $\phi 1$ denoting a phase change observed when light having wavelengths is reflected by the first light reflection boundary face;

with notation $\phi 2$ denoting a phase change observed when light having wavelengths is reflected by the second light reflection boundary face;

with notation $\phi 3$ denoting a phase change observed when light having wavelengths is reflected by the third light reflection boundary face; and with notation $\phi 4$ denoting a phase change observed when light having wavelengths is reflected by the fourth light reflection boundary face, the optical distances L1, L2, L3 and L4 satisfy all Expressions (1) to (8) given as above.

On top of that, the present technology also provides a display apparatus employing a plurality of light emitting devices which are used for emitting light having plain colors different from each other and each include:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face, a third light reflection boundary face and a fourth light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation L4 denoting an optical distance between the luminescence center and the fourth light reflection boundary face;

with notation $\lambda 1$ denoting the center wavelength of a light emission spectrum of the light emitting layer;

with notations n, m, m' and m'' each denoting an integer;

with notations $\lambda 11$, $\lambda 12$, $\lambda 13$ and $\lambda 14$ each denoting an interference wavelength;

with the length unit nanometer taken as a unit of the wavelengths $\lambda 1$, $\lambda 11$, $\lambda 12$, $\lambda 13$ and $\lambda 14$;

with notation $\phi 1$ denoting a phase change observed when light having wavelengths is reflected by the first light reflection boundary face;

with notation $\phi 2$ denoting a phase change observed when light having wavelengths is reflected by the second light reflection boundary face;

with notation $\phi 3$ denoting a phase change observed when light having wavelengths is reflected by the third light reflection boundary face; and with notation $\phi 4$ denoting a phase change observed when light having wavelengths is reflected by the fourth light reflection boundary face, the optical distances L1, L2, L3 and L4 satisfy all Expressions (1) to (8) given as above.

The luminescence center of a light emitting layer implies a surface on which the peak of a light emission strength distribution in the thickness direction of the light emitting layer is positioned. Normally, the luminescence center of a light emitting layer divides the thickness of the light emitting layer into to equal partial thicknesses. Monochromatic light emitted by a light emitting layer is typically monochromatic light in the visible-light domain.

Expression (1) is an equation used for setting the optical distance L1 between the first light reflection boundary face and the luminescence center of the light emitting layer at such a value that light having the center wavelength $\lambda 1$ of the light emission spectrum of the light emitting layer is mutually strengthened by interferences occurring between the first light reflection boundary face and the luminescence center of the light emitting layer.

Expression (2) is an equation expressing a condition for broadening the band of the interference wavelength $\lambda 11$ for the case described above.

Expression (3) is an equation used for setting the optical distance L2 between the second light reflection boundary face and the luminescence center of the light emitting layer at such a value that light having the center wavelength $\lambda 1$ of the light emission spectrum of the light emitting layer is mutually strengthened by interferences occurring between the second light reflection boundary face and the luminescence center of the light emitting layer while shifting the interference wavelength $\lambda 12$ from the center wavelength $\lambda 1$ of the light emission spectrum of the light emitting layer (that is, $\lambda 12 \neq \lambda 1$).

Expression (6) is an equation expressing a condition for broadening the band of the interference wavelength $\lambda 12$ for the case described above.

Expression (4) is an equation used for setting the optical distance L3 between the third light reflection boundary face and the luminescence center of the light emitting layer at such a value that light having the center wavelength $\lambda 1$ of the light emission spectrum of the light emitting layer is mutually strengthened by interferences occurring between the third light reflection boundary face and the luminescence center of the light emitting layer while shifting the interference wavelength $\lambda 13$ from the center wavelength $\lambda 1$ of the light emission spectrum of the light emitting layer (that is, $\lambda 13 \neq \lambda 1$).

Expression (7) is an equation expressing a condition for broadening the band of the interference wavelength $\lambda 13$ for the case described above.

Expression (5) is an equation used for setting the optical distance L4 between the fourth light reflection boundary face and the luminescence center of the light emitting layer at such a value that light having the center wavelength $\lambda 1$ of the light emission spectrum of the light emitting layer is mutually strengthened by interferences occurring between the fourth light reflection boundary face and the luminescence center of the light emitting layer while shifting the interference wavelength $\lambda 14$ from the center wavelength $\lambda 1$ of the light emission spectrum of the light emitting layer (that is, $\lambda 14 \neq \lambda 13 \neq \lambda 1$).

Expression (8) is an equation expressing a condition for broadening the band of the interference wavelength $\lambda 14$ for the case described above.

The interference wavelengths $\lambda 11$, $\lambda 12$, $\lambda 13$ and $\lambda 14$ of Expressions (1), (3), (4) and (5) respectively are found from the center wavelength $\lambda 1$ on the basis of Expressions (2), (6), (7) and (8) respectively.

The values of the integers n, m, m' and m'' are selected as necessary. In order to increase the quantity of light that can be fetched from the light emitting device, it is desirable to set the integer n at a value satisfying the relation $n \leq 5$. It is most desirable to set the integer n at a value satisfying the relation $n=0$ and set the integer m at a value satisfying the relation $m=0$.

With this light emitting device, the peak of a spectroscopic transmittance curve of an interference filter in the light emitting device can be made all but flat in the visible-light domain. In other words, the gradients of the bands of all light emission colors can be made approximately equal to each other. Thus, for monochromatic light, the light emitting device is capable of making a luminance decrease equal to or smaller than 30% of a luminance for a viewing angle of 0 degrees and setting a chromaticity shift $\Delta uv$ at a value satisfying the relation $\Delta uv \leq 0.015$. In this case, the luminance decrease is a decrease from the luminance for the viewing angle of 0 degrees to the luminance for a viewing angle of 45 degrees.

Typically, the second light reflection boundary face is configured by making use of a metallic thin film having a non-zero extinction coefficient and a thickness of at least 5 nm. This metallic thin film can be used as a semi-transparent light reflection layer capable of transmitting visible light. Typically, the third light reflection boundary face and the fourth light reflection boundary face can each be configured by making use of a refractive index difference.

As necessary, it is possible to provide a fifth light reflection boundary face for adjusting the flatness of the peak of a spectroscopic transmittance curve of an interference filter in the light emitting device in addition to the first light reflection boundary face, the second light reflection boundary face, the third light reflection boundary face and the fourth light reflection boundary face. In addition, as necessary, it is also possible to divide at least one of the second light reflection boundary face, the third light reflection boundary face, the fourth light reflection boundary face and the fifth light reflection boundary face into a plurality of light reflection boundary faces. In this way, for example, it is possible to broaden a wavelength band for mutually strengthening light reflections caused by the second light reflection boundary face and broaden a wavelength band for mutually weakening light reflections caused by the third light reflection boundary face, light reflections caused by the fourth light reflection boundary face and light reflections caused by the fifth light reflection boundary face. Thus, it is possible to widen a flat portion of the peak of a spectroscopic transmittance curve of an interference filter in the light emitting device and, hence, possible to improve the viewing-angle characteristic.

The light emitting device can be configured to have an upper-surface light emission type or a lower-surface light emission type. In a light emitting device having the upper-surface light emission type, the first electrode, the organic layer and the second electrode are created sequentially on a substrate to form a stack. In a light emitting device having the lower-surface light emission type, on the other hand, the second electrode, the organic layer and the first electrode are created sequentially on a substrate to form a stack. The substrate of the light emitting device having the upper-surface light emission type can be non-transparent or transparent. That is to say, a non-transparent substrate or a transparent substrate can be selected as necessary to serve as the substrate of the light emitting device having the upper-surface light emission type. On the other hand, the substrate of the light emitting device having the lower-surface light emission type is a transparent substrate allowing light emitted from the side close to the second electrode to propagate to the outside of the light emitting device.

For the purpose of improving the reliability and for other reasons such as the adopted configuration, another light reflection layer can be further created in the light emitting device in some cases so that another light reflection boundary face is further created. In such cases, after creation of light reflection boundary faces up to the fourth light reflection boundary face, the fifth light reflection boundary face or, more generally, the last light reflection boundary face required for optical operations, a layer having a thickness of at least 1 μm is created thereon so as to allow the effect of interferences occurring thereafter to be ignored all but completely. As a material provided on the outer side of the last light reflection boundary face created in this case, a material having any quality can be used, allowing the material suitable for the implementation of the light emitting device to be selected properly. To put it concretely, the material provided on the outer side of the last light reflection boundary face can be created from one, two or more layers each having a thickness of at least 1 μm. Typical examples of the layers are a transparent electrode layer, a transparent insulation layer, a resin layer, a glass layer and an air layer. Nevertheless, the material provided on the outer side of the last light reflection boundary face does not have to be created from such layers.

Each of the illumination apparatus and the display apparatus can have the configuration of related art. That is to say, each of the illumination apparatus and the display apparatus can be properly configured in accordance with consideration factors such as the application and/or the functions. A typical display apparatus has a driving substrate in which active devices (such as thin-film transistors) each used for supplying a display signal for every display pixel to one of the light emitting devices are provided. The typical display apparatus also includes a sealing substrate provided to face the driving substrate. The light emitting devices are provided between the driving substrate and the sealing substrate. This display apparatus can be a white-color display apparatus, black/white display apparatus or a color display apparatus. In the case of a color display apparatus, one of the driving substrate and the sealing substrate is typically a substrate on the side close to the second electrode of each of the light emitting devices. In such a color display apparatus, a color filter is provided on the substrate on the side close to the second electrode to serve as a filter for transmitting light radiated from the side close to the second electrode to the substrate on the side close to the second electrode.

In addition, the present technology also provides a light emitting device including:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face and a third light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation λ1 denoting the center wavelength of a light emission spectrum of the light emitting layer;

with notations n, m and m' each denoting an integer;

with notations λ11, λ12 and λ13 each denoting an interference wavelength;

with the length unit nanometer taken as a unit of the wavelengths λ1, λ11, λ12 and λ13;

with notation φ1 denoting a phase change observed when light having wavelengths is reflected by the first light reflection boundary face;

with notation φ2 denoting a phase change observed when light having wavelengths is reflected by the second light reflection boundary face; and with notation φ3 denoting a phase change observed when light having wavelengths is reflected by the third light reflection boundary face, the optical distances L1, L2 and L3 satisfy all Expressions (9) to (14) given as follows:

$$\text{where } n \geq 0,\ 2L1/\lambda 11 + \phi 1/2\pi = n \tag{9}$$

$$\lambda 1 - 150 < \lambda 11 < \lambda 1 + 80 \tag{10}$$

$$2L2/\lambda 12 + \phi 2/2\pi = m \tag{11}$$

$$2L3/\lambda 13 + \phi 3/2\pi = m' + 1/2 \tag{12}$$

$$\lambda 1 - 80 < \lambda 12 < \lambda 1 + 80 \tag{13}$$

$$\lambda 1 - 150 < \lambda 13 < \lambda 1 + 150 \tag{14}$$

In addition, the present technology also provides an illumination apparatus employing a plurality of light emitting devices which are used for emitting light having plain colors different from each other and each include:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face and a third light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation $\lambda 1$ denoting the center wavelength of a light emission spectrum of the light emitting layer;

with notations n, m and m' each denoting an integer;

with notations $\lambda 11$, $\lambda 12$ and $\lambda 13$ each denoting an interference wavelength;

with the length unit nanometer taken as a unit of the wavelengths $\lambda 1$, $\lambda 11$, $\lambda 12$ and $\lambda 13$;

with notation $\phi 1$ denoting a phase change observed when light having wavelengths is reflected by the first light reflection boundary face;

with notation $\phi 2$ denoting a phase change observed when light having wavelengths is reflected by the second light reflection boundary face; and with notation $\phi 3$ denoting a phase change observed when light having wavelengths is reflected by the third light reflection boundary face, the optical distances L1, L2 and L3 satisfy all Expressions (9) to (14) given as above.

On top of that, the present technology also provides a display apparatus employing a plurality of light emitting devices which are used for emitting light having plain colors different from each other and each include:

an organic layer sandwiched between a first electrode and a second electrode to serve as an organic layer including a light emitting layer for emitting monochromatic light at one location;

a first light reflection boundary face provided on a side close to the first electrode to serve as a boundary face for reflecting light emitted from the light emitting layer so as to radiate the reflected light from a side close to the second electrode; and a second light reflection boundary face and a third light reflection boundary face which are sequentially provided at positions separated away from each other in a direction from the first electrode to the second electrode on the side close to the second electrode.

In the light emitting device, with notation L1 denoting an optical distance between the first light reflection boundary face and the luminescence center of the light emitting layer;

with notation L2 denoting an optical distance between the luminescence center and the second light reflection boundary face;

with notation L3 denoting an optical distance between the luminescence center and the third light reflection boundary face;

with notation $\lambda 1$ denoting the center wavelength of a light emission spectrum of the light emitting layer;

with notations n, m and m' each denoting an integer;

with notations $\lambda 11$, $\lambda 12$ and $\lambda 13$ each denoting an interference wavelength;

with the length unit nanometer taken as a unit of the wavelengths $\lambda 1$, $\lambda 11$, $\lambda 12$ and $\lambda 13$;

with notation $\phi 1$ denoting a phase change observed when light having wavelengths is reflected by the first light reflection boundary face;

with notation $\phi 2$ denoting a phase change observed when light having wavelengths is reflected by the second light reflection boundary face; and with notation $\phi 3$ denoting a phase change observed when light having wavelengths is reflected by the third light reflection boundary face, the optical distances L1, L2 and L3 satisfy all Expressions (9) to (14) given as above.

The light emitting device explained above is different from the light emitting device explained earlier in that, even though the light emitting device explained above does require the first light reflection boundary face, the second light reflection boundary face and the third light reflection boundary face, the light emitting device explained above does not require the fourth light reflection boundary face.

By the same token, the illumination apparatus explained above is different from the illumination apparatus explained earlier in that, even though the illumination apparatus explained above does require the first light reflection boundary face, the second light reflection boundary face and the third light reflection boundary face, the illumination apparatus explained above does not require the fourth light reflection boundary face.

In the same way, the display apparatus explained above is different from the display apparatus explained earlier in that, even though the display apparatus explained above does require the first light reflection boundary face, the second light reflection boundary face and the third light reflection boundary face, the display apparatus explained above does not require the fourth light reflection boundary face.

The fourth light reflection boundary face is required as necessary to serve as a light reflection boundary face used for adjusting the flatness of the peak of a spectroscopic transmittance curve of an interference filter in the light emitting device. The other descriptions of the light emitting device, the illumination apparatus and the display apparatus which are explained earlier hold true for the light emitting device, the illumination apparatus and the display apparatus which are explained above as long as the other descriptions are not against the characteristics of the light emitting device, the illumination apparatus and the display apparatus which are explained above.

In accordance with the present technology, it is possible to implement a light emitting device capable of emitting light that can be well fetched over a broad wavelength band and capable of substantially reducing the viewing-angle dependence of the luminance and the viewing-angle dependence of the color phase for monochromatic light.

In addition, in accordance with the present technology, it is possible to implement an illumination apparatus which has little viewing-angle dependence, has a good light distribution characteristic and can be manufactured easily with a high degree of productivity.

On top of that, in accordance with the present technology, it is possible to implement a display apparatus which is capable of displaying an image having little viewing-angle dependence and having a high quality and can be manufactured easily with a high degree of productivity.

Additional features and advantages are described herein, and will be apparent from the following Detailed Description and the figures.

BRIEF DESCRIPTION OF THE FIGURES

FIG. 3 is a diagram roughly showing a spectroscopic transmittance curve of an interference filter due to the first light reflection boundary face and a spectroscopic transmittance curve of a synthesized interference filter due to the first and second light reflection boundary faces in the organic EL device according to the first embodiment;

FIG. 5 is a diagram roughly showing a spectroscopic transmittance curve of a synthesized interference filter due to the first, second, third and fourth light reflection boundary faces in the organic EL device according to the first embodiment;

DETAILED DESCRIPTION

Embodiments of the present technology are explained as follows. The embodiments are described in chapters arranged in the following order:

1. First Embodiment (Organic EL Device)
2. Second Embodiment (Organic EL Device)
3. Third Embodiment (Organic EL Device)
4. Fourth Embodiment (Organic EL Illumination Apparatus)
5. Fifth Embodiment (Organic EL Display Apparatus)

1. First Embodiment (Organic EL Device)

Figure 1:
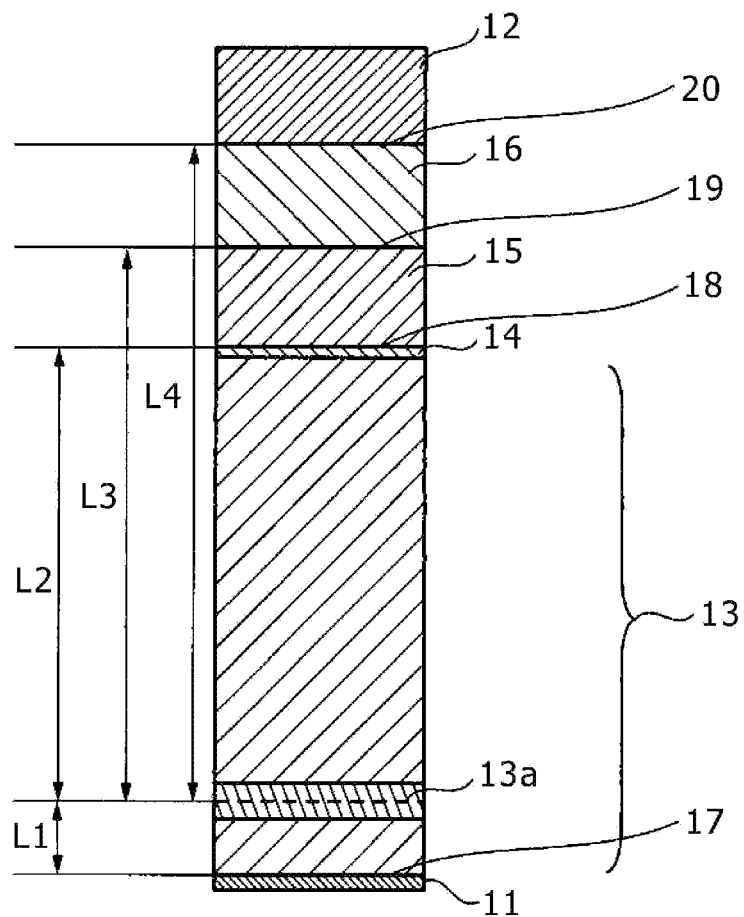
FIG. 1 is a cross-sectional diagram showing an organic EL device according to a first embodiment.

FIG. 1 is a cross-sectional diagram showing an organic EL device according to a first embodiment.

As shown in FIG. 1, in this organic EL device, an organic layer 13 is sandwiched between a first electrode 11 and a second electrode 12 to serve as an organic layer including a light emitting layer 13a for emitting monochromatic light at one location. The luminescence center of the light emitting layer 13a is denoted by notation O. The organic layer 13 includes portions above and below the light emitting layer 13a. As necessary, each of these portions above and below the light emitting layer 13a includes layers such as a hole injection layer, a hole transporting layer, an electron transporting layer and an electron injection layer as is the case with the organic EL device known in the past. In this case, the second electrode 12 is typically a transparent electrode for transmitting visible light so that the light is radiated from the side close to the second electrode 12. The light emitting layer 13a emits typically monochromatic light in the visible-light domain. The light emission wavelength of the light emitting layer 13a is selected in accordance with the color of light to be emitted by the organic EL device. Between the organic layer 13 and the second electrode 12, a metallic film 14, a conductive transparent layer 15 and a conductive transparent layer 16 are sequentially provided at positions separated away from each other in a direction from the first electrode 11 to the second electrode 12. Each of the metallic film 14, the transparent layer 15 and the transparent layer 16 is a transmissive layer through which light emitted by the light emitting layer 13a is capable of penetrating. As necessary, each of the transparent layer 15 and the transparent layer 16 can be configured as a stack including two or more layers. The first electrode 11, the second electrode 12, the organic layer 13, the light emitting layer 13a, the metallic film 14, the transparent layer 15 and the transparent layer 16 can each be made from a material which can be selected from those known in the past as necessary.

The refractive index of the organic layer 13 is different from the refractive index of the first electrode 11. The difference between these refractive indexes causes a first light reflection boundary face 17 to be created between the organic layer 13 and the first electrode 11. As necessary, the first light reflection boundary face 17 may be provided at a position separated away from the first electrode 11. The first light reflection boundary face 17 plays a role to reflect light emitted by the light emitting layer 13a in order to radiate the reflected light from the side close to the second electrode 12.

The metallic film 14 is configured by making use of a metallic material having a non-zero extinction coefficient and a thickness of at least 5 nm. A second light reflection boundary face 18 is created between the organic layer 13 and the metallic film 14.

By the same token, the refractive index of the transparent layer 15 is different from the refractive index of the transparent layer 16. The difference between these refractive indexes causes a third light reflection boundary face 19 to be created between the transparent layer 15 and the transparent layer 16.

In the same way, the refractive index of the transparent layer 16 is different from the refractive index of the second electrode 12, and the difference between these refractive indexes causes a fourth light reflection boundary face 20 to be created between the transparent layer 16 and the second electrode 12.

In FIG. 1, notation L1 denotes an optical distance between the first light reflection boundary face 17 and the luminescence center O of the light emitting layer 13a, notation L2 denotes an optical distance between the luminescence center O and the second light reflection boundary face 18, notation L3 denotes an optical distance between the luminescence center O and the third light reflection boundary face 19 whereas notation L4 denotes an optical distance between the luminescence center O and the fourth light reflection boundary face 20. The optical distances L1, L2, L3 and L4 are set at such values that the optical distances L1, L2, L3 and L4 satisfy all Expressions (1) to (8) given earlier.

To be more specific, the optical distance L1 is set at such a value that light having the center wavelength $\lambda 1$ of the light emission spectrum of the light emitting layer 13a is mutually strengthened by interferences occurring between the first light reflection boundary face 17 and the luminescence center O of the light emitting layer 13a.

By the same token, the optical distance L2 is set at such a value that light having the center wavelength $\lambda 1$ of the light emission spectrum of the light emitting layer 13a is mutually strengthened by interferences occurring between the second light reflection boundary face 18 and the luminescence center O of the light emitting layer 13a.

In the same way, the optical distance L3 is set at such a value that light having the center wavelength $\lambda 1$ of the light emission spectrum of the light emitting layer 13a is mutually weakened by interferences occurring between the third light reflection boundary face 19 and the luminescence center O of the light emitting layer 13a.

By the same token, the optical distance L4 is set at such a value that light having the center wavelength $\lambda 1$ of the light emission spectrum of the light emitting layer 13a is mutually weakened by interferences occurring between the fourth light reflection boundary face 20 and the luminescence center O of the light emitting layer 13a.

Figure 2:
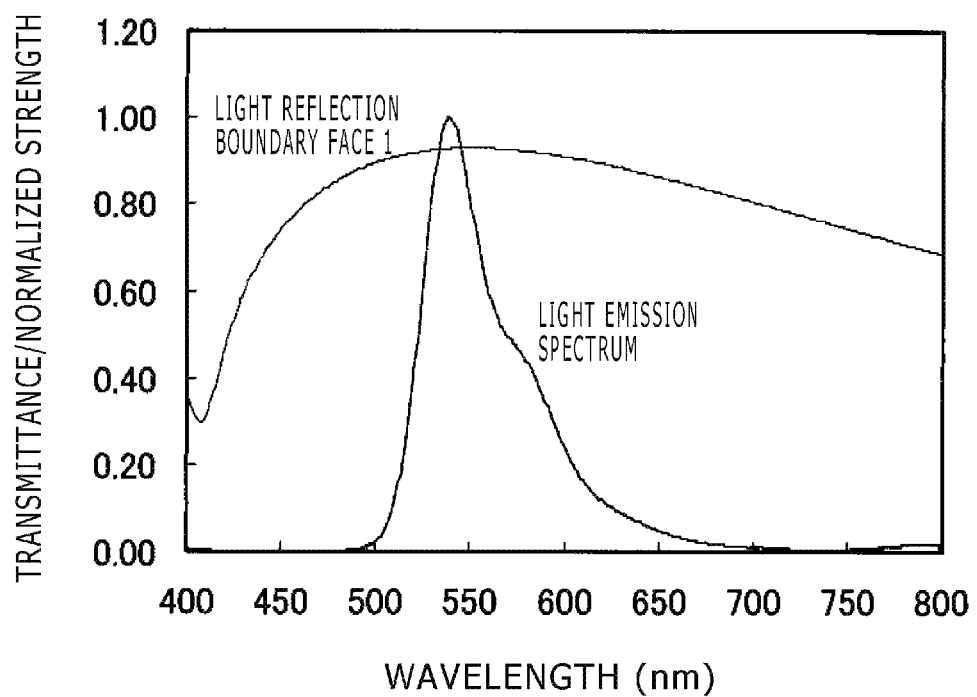
FIG. 2 is a diagram roughly showing a spectroscopic transmittance curve of an interference filter due to a first light reflection boundary face in the organic EL device according to the first embodiment.

As an example, a state for $\lambda 1 = 575$ nm is expressed by equations as follows, satisfying Expressions (1) to (4). At that time, the light emitting layer 13a exists at a position where the 0th-order (n=0 in Expression (1)) interference occurs. Thus, the transmittance is high over a broad band and, as is obvious from Expression (2), the interference wavelength $\lambda 11$ can also be much shifted from the center wavelength $\lambda 1$ of the light emission spectrum of the light emitting layer 13a. For the transmittance, the reader is requested to refer to FIG. 2 showing the transmittance of an interference filter of the first light reflection boundary face 17 for the light emitting layer 13a. In FIG. 2, the first light reflection boundary face 17 is shown as light reflection boundary face 1.

$$2L1/\lambda 11 + \phi 1/2\pi = 0 \quad (1)'$$

For the above equation, the following relations hold true:

$$\lambda 1 - 150 = 425 < \lambda 11 = 540 < \lambda 1 + 80 = 655 \text{ nm} \quad (2)'$$

From the equations, a phase change $\phi 1$ can be computed by making use of a refractive index $n°$, an extinction coefficient k and a refractive index $n_O$ of the organic layer 13 brought into contact with the first electrode 11. The refractive index $n°$ and the extinction coefficient k satisfy the equation $N = n° - jk$ where notation N denotes the complex refractive index of the first electrode 11. For more information on the computation of the phase change $\phi 1$, the reader is advised to refer to documents such as a book authored by Max Born and Emil Wolf and published by Pergamon Press in 1974 with a title of "Principles of Optics." The refractive index of the organic layer 13 and those of the transparent layers 15 and 16 can be measured by making use of a spectroscopic ellipsometry measurement apparatus.

A typical computation of the phase change $\phi 1$ is explained as follows. The first electrode 11 is assumed to be made from an Al (aluminum) alloy. In this case, for light having a wavelength of 575 nm (corresponding to the center wavelength $\lambda 1$ of the light emission spectrum of the first light emitting layer 13a), $n° = 0.908$ and $k = 5.927$. If the refractive index of the organic layer 13 is 1.75 ($n_O = 1.75$), the phase change $\phi 1$ can be expressed as follows:

$$\phi 1 = \tan^{-1}\{(2n_O k/((n°)^2 + k^2 - n_O^2))\} = \tan^{-1}(0.577)$$

If the range $-2\pi < \phi 1 \leq 0$ is taken into consideration, the phase change $\phi 1$ is found to be $-2.618$ radians (that is, $\phi 1 = -2.618$). This value of the phase change $\phi 1$ is substituted into Expression (1)' to find the value of the optical distance L1 to be 101 nanometers (that is, $L1 = 101$ nm).

It is to be noted that, if the refractive index $n°$ of the first electrode 11 is greater than the refractive index $n_O$ of the organic layer 13, the phase change $\phi 1$ is further increased by $\pi$ radians. If the refractive index $n°$ of the first electrode 11 is smaller than the refractive index $n_O$ of the organic layer 13, on the other hand, the phase change $\phi 1$ is increased by 0 radians.

At that time, the state of the interference filter due to the first light reflection boundary face 17 of the light emitting layer 13a satisfies a mutually strengthening condition. Thus, as shown in FIG. 2, the spectroscopic transmittance curve has a peak portion indicating an increased degree of light fetching. However, due to observation carried out in an inclined direction, the wavelength band of the interference filter is shifted in a direction toward small wavelengths to result in a luminance change and a color-phase change.

Then, the second light reflection boundary face 18 is created between the organic layer 13 having a refractive index $n_O$ of 1.75 (that is, $n_O = 1.75$) and the metallic film 14 having a typical thickness of 6.0 nm. Subsequently, the third light reflection boundary face 19 is created between the transparent layer 15 having a typical refractive index of 1.8 and the transparent layer 16 having a refractive index different from this typical refractive index of the transparent layer 15. For example, the transparent layer 16 has a refractive index of 1.5. Then, the fourth light reflection boundary face 20 is created between the transparent layer 16 and the second electrode 12 having a refractive index different from the refractive index of the transparent layer 16. For example, the second electrode 12 has a refractive index of 1.8.

As a material used for making the transparent layer 15 having a refractive index of 1.8 and the second electrode 12 also having a refractive index of 1.8, for example, the ITO (Indium Tin Oxide) selecting an oxygen composition or the like can be used. As a material used for making the transparent layer 16 having a refractive index of 1.5, for example, a ?????

can be used. In this case, if the optical distance L2 is set at a typical value of 108 nm, the optical distance L3 is set at a typical value of 180 nm and the optical distance L4 is set at a typical value of 230 nm, the light reflection by the second light reflection boundary face 18, the light reflection by the third light reflection boundary face 19 and the light reflection by the fourth light reflection boundary face 20 satisfy conditions given below. The condition satisfied by the light reflection by the second light reflection boundary face 18 is a mutually strengthening condition for $\lambda11=\lambda12$ or $\lambda11\approx\lambda12$. On the other hand, the condition satisfied by the light reflection by the third light reflection boundary face 19 and the condition satisfied by the light reflection by the fourth light reflection boundary face 20 are each a condition for mutually weakening the light reflections while shifting the interference wavelengths $\lambda13$ and $\lambda14$ from the center wavelength $\lambda1$, that is, $\lambda13\neq\lambda14\neq\lambda1$. The conditions are expressed by the following equations:

$$2L2/\lambda12+\phi2/2\pi=m \quad (3)'$$

$$2L3/\lambda13+\phi3/2\pi=m'+1/2 \quad (4)'$$

$$2L4/\lambda14+\phi4/2\pi=m''+1/2 \quad (5)'$$

The unit of the interference wavelengths $\lambda12$, $\lambda13$ and $\lambda14$ is the length unit nanometer.

The phase changes $\phi2$, $\phi3$ and $\phi4$ used in the above equations can be computed in the same way as the phase change $\phi1$ described above.

Thus, all the conditions expressed by Expressions (1) to (8) are satisfied.

FIG. 3 is a diagram roughly showing a spectroscopic transmittance curve of an interference filter due to the first light reflection boundary face 17 and a spectroscopic transmittance curve of a synthesized interference filter due to the first light reflection boundary face 17 and the second light reflection boundary face 18. In FIG. 3, the first light reflection boundary face 17 and the second light reflection boundary face 18 are shown as light reflection boundary face 1 and light reflection boundary face 2 respectively. In this case, the wavelength condition of the first light reflection boundary face 17 is close to the wavelength condition of the second light reflection boundary face 18. For wavelengths close to a wavelength of 550 nm, the transmittance is improved. Since the peak of the spectroscopic transmittance curve of a synthesized interference filter due to the first light reflection boundary face 17 and the second light reflection boundary face 18 is strengthened, however, the light of the green color cannot be fetched with good balance. In addition, since a flat portion cannot be obtained in this spectroscopic transmittance curve, the viewing-angle characteristic shows striking changes for both the luminance and the color phase.

Figure 4:
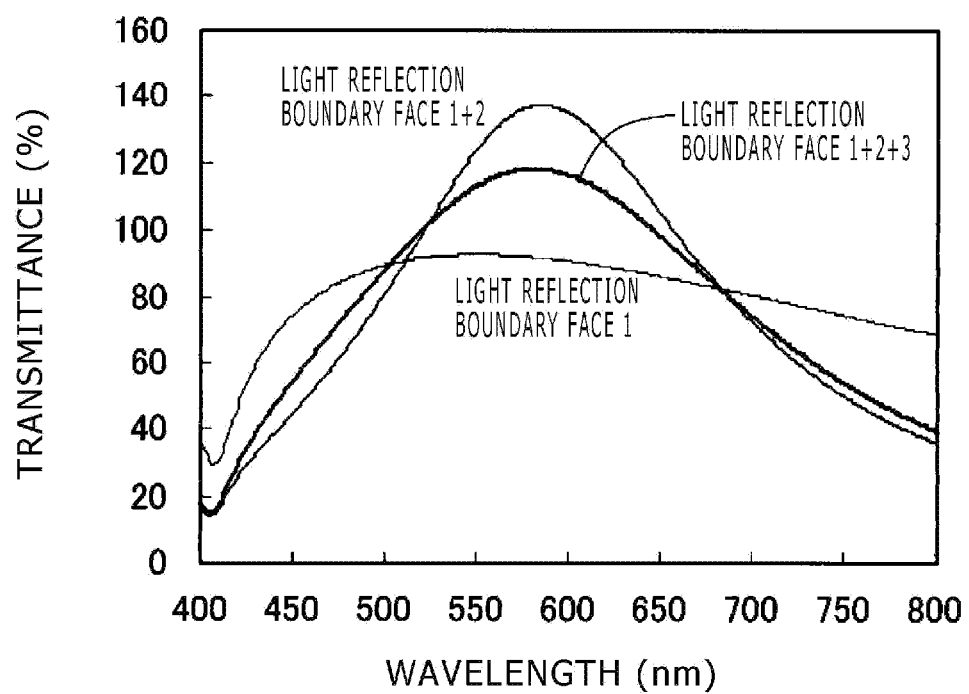
FIG. 4 is a diagram roughly showing a spectroscopic transmittance curve of an interference filter due to the first light reflection boundary face, a spectroscopic transmittance curve of a synthesized interference filter due to the first and second light reflection boundary faces and a spectroscopic transmittance curve of a synthesized interference filter due to the first, second and third light reflection boundary faces in the organic EL device according to the first embodiment.

FIG. 4 is a diagram roughly showing a spectroscopic transmittance curve of an interference filter due to the first light reflection boundary face 17, a spectroscopic transmittance curve of a synthesized interference filter due to the first light reflection boundary face 17 and the second light reflection boundary face 18 and a spectroscopic transmittance curve of a synthesized interference filter due to the first light reflection boundary face 17, the second light reflection boundary face 18 and the third light reflection boundary face 19 in order to show an effect of the third light reflection boundary face 19. In FIG. 4, the first light reflection boundary face 17, the second light reflection boundary face 18 and the third light reflection boundary face 19 are shown as light reflection boundary face 1, light reflection boundary face 2 and light reflection boundary face 3 respectively. As shown in FIG. 4, in this state, the spectroscopic transmittance curve of a synthesized interference filter due to the first light reflection boundary face 17, the second light reflection boundary face 18 and the third light reflection boundary face 19 cannot be made completely flat yet. This is because, with only the third light reflection boundary face 19 created on the basis of a difference in refractive index, the reflection strength is small so that the mutual strengthening created by the metallic film 14 cannot be cancelled out sufficiently.

FIG. 5 is a diagram roughly showing a spectroscopic transmittance curve of an interference filter due to the first light reflection boundary face 17, the second light reflection boundary face 18, the third light reflection boundary face 19 and the fourth light reflection boundary face 20 in order to show an effect of the fourth light reflection boundary face 20. As is obvious from FIG. 5, in the area of light having the green color, an all but flat interference filter can be created.

Figure 6:
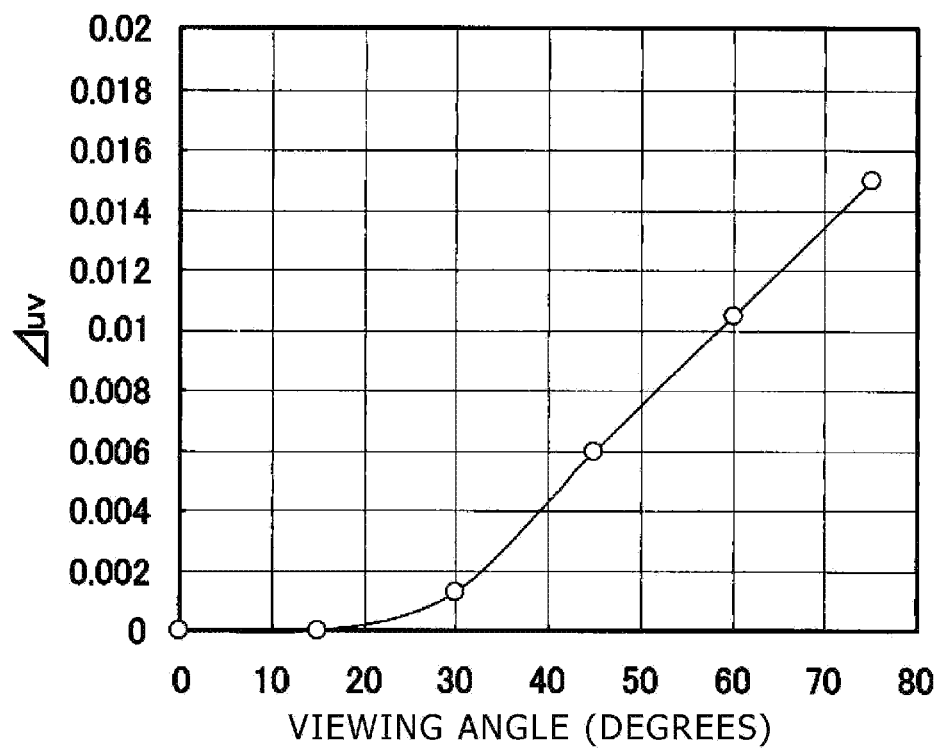
FIG. 6 is a diagram roughly showing a viewing-angle characteristic of the chromaticity of the organic EL device according to the first embodiment.
Figure 7:
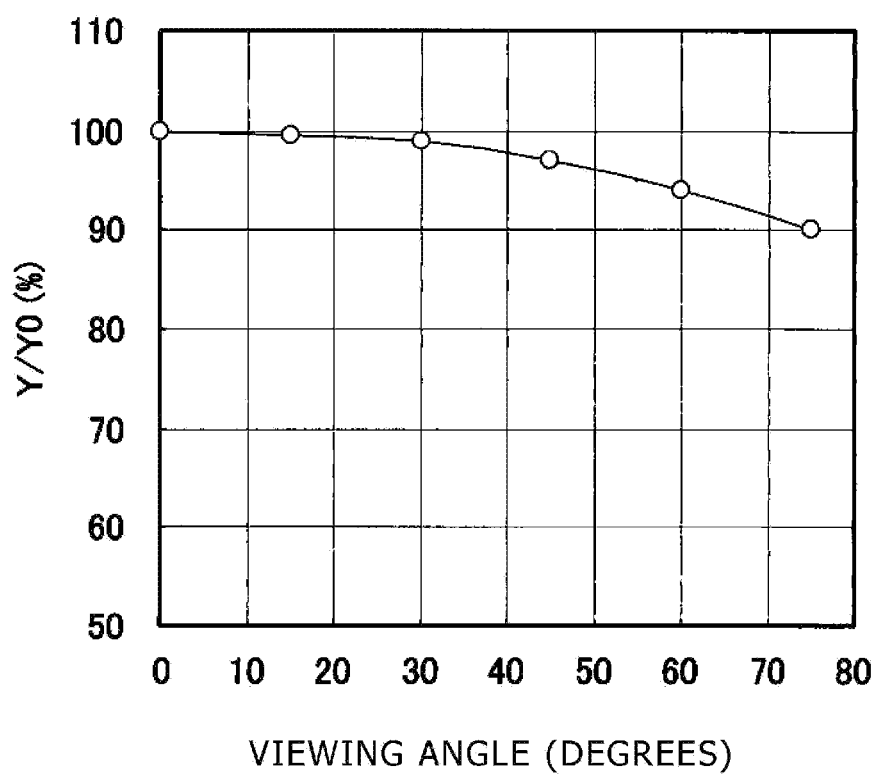
FIG. 7 is a diagram roughly showing a viewing-angle characteristic of the luminance of the organic EL device according to the first embodiment.

FIG. 6 is a diagram roughly showing a viewing-angle characteristic of the chromaticity of the green-color light in this state whereas FIG. 7 is a diagram roughly showing a viewing-angle characteristic of the luminance of the green-color light in this state. As is obvious from FIG. 7, at least 85% of the luminance obtained at a viewing angle of 0 degrees can be sustained at a viewing angle of 45 degrees. As is obvious from FIG. 6, on the other hand, the relation chromaticity shift $\Delta uv \leq 0.015$ can also be implemented for the chromaticity.

Figure 8:
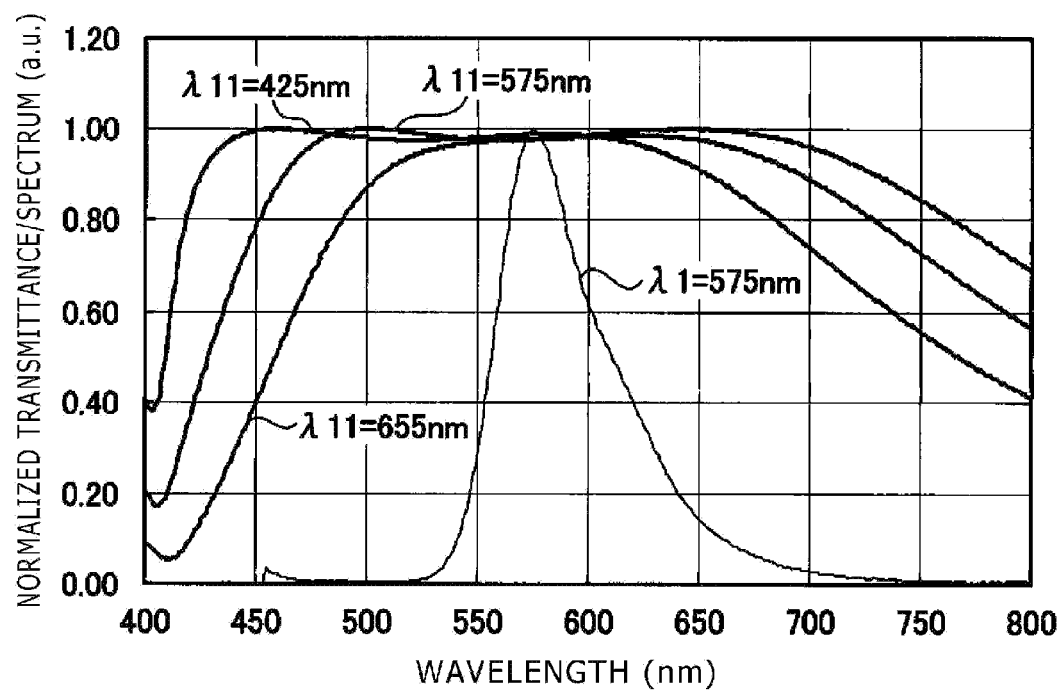
FIG. 8 is a diagram roughly showing spectroscopic transmittance curves which are each similar to that shown in FIG. 5 and each serve as a curve of an interference filter for values computed in accordance with Expression (2) on the basis of a center wavelength $\lambda 1$ of 575 nm (that is, $\lambda 1=575$ nm) as values of an interference wavelength $\lambda 11$.

FIG. 5 shows results of computation for $\lambda11=540$ nm. (The reader is requested to refer to Expression (2)'). If the interference wavelength $\lambda11$ has a value in the range defined by Expression (2), however, the same results can be obtained. That is to say, FIG. 8 is a diagram roughly showing spectroscopic transmittance curves of an interference filter for values computed in accordance with Expression (2) on the basis of a center wavelength $\lambda1$ of 575 nm (that is, $\lambda1=575$ nm) as values of an interference wavelength $\lambda11$. As is obvious from FIG. 8, if the value of the interference wavelength $\lambda11$ is in the range according to Expression (2), in the area of light having the green color, an all but flat interference filter can be created.

In accordance with the first embodiment described above, in the organic EL device, the organic layer 13 sandwiched between the first electrode 11 and the second electrode 12 has the light emitting layer 13a for emitting monochromatic light such as typically monochromatic light of the visible-light domain. On the side close to the first electrode 11, the first light reflection boundary face 17 is created. On the side close to the second electrode 12 for radiating the light, on the other hand, the second light reflection boundary face 18, the third light reflection boundary face 19 and the fourth light reflection boundary face 20 are created.

In addition, the optical distances L1, L2, L3 and L4 shown in FIG. 1 are each set at such a value that all Expressions (1) to (8) are satisfied. As a result, the transmittance of the interference filter in the organic EL device is high in a wavelength band of monochromatic light such as the light having the green color so that the light can be well fetched in this wavelength band.

On top of that, for the light having the green color for example, the organic EL device is capable of substantially reducing the viewing-angle dependence of the luminance and the viewing-angle dependence of the chromaticity.

In addition, the organic EL device allows the color of the emitted light to be selected by designing, among others, the thickness of the light emitting layer 13a even if the thickness of the transparent layer 15 and the thickness of the transparent layer 16 are fixed. Thus, if organic EL devices having emitted light colors different from each other are to be manufactured, for example, only the thickness of the light emitting layer 13a needs to be changed so that the organic EL devices having emitted light colors different from each other can be manufactured with ease with a high degree of productivity.

On top of that, since the transmittance of the interference filter in the organic EL device is high, the power consumption of the device is low.

Figure 9:
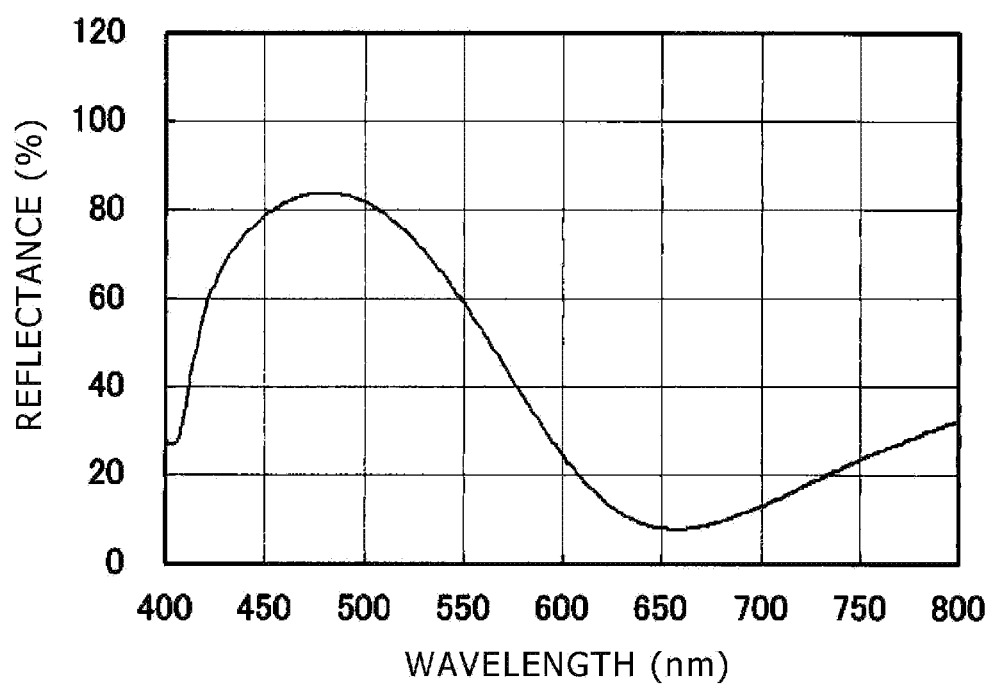
FIG. 9 is a diagram roughly showing a spectroscopic reflection curve of the organic EL device according to the first embodiment.

The second light reflection boundary face 18 is created at a position where light emitted by the light emitting layer 13*a* is amplified. Since the metallic film 14 having a thickness equal to or greater than 5 nm is created on the second light reflection boundary face 18, however, in addition to the amplification effect of the micro-cavity (a small resonator), the extinction coefficient of the metallic film 14 causes light absorption to occur during the multiple reflections so that it is possible to generate an effect of eliminating reflections of external light. A spectroscopic reflection characteristic for this case is shown in FIG. 9. In addition, by providing a color filter on the light radiation side in the organic EL device, the reflections of external light can be further suppressed. The effect of eliminating the reflections of external light makes the organic EL device capable of displaying a bright image even if the device is used at a location receiving external light.

2. Second Embodiment (Organic EL Device)

An organic EL device according to a second embodiment is obtained by splitting each of the third light reflection boundary face 19 and the fourth light reflection boundary face 20 which are included in the organic EL device according to the first embodiment into two light reflection boundary faces, that is, front and rear light reflection boundary faces respectively, in order to broaden the wavelength bands of the reverse-phase interference conditions expressed by Expressions (4) and (5). That is to say, in the case of Expression (4) for example, the third light reflection boundary face 19 is split into front and rear light reflection boundary faces separated away from each other by a distance $\Delta$. With the third light reflection boundary face 19 split into such front and rear light reflection boundary faces, the optical distance L3 becomes L3+$\Delta$ and L3−$\Delta$. Thus, the band of the interference wavelength $\lambda13$ for which Expression (4) holds true increases. This description is applicable to the band of the interference wavelength $\lambda14$ used in Expression (5).

The second embodiment offers the same merits as the first embodiment. In addition, it is also possible to broaden the wavelength bands of the reverse-phase interference conditions expressed by Expressions (4) and (5). Thus, the second embodiment also has a merit that the viewing-angle characteristic of the organic EL device can be further improved.

3. Third Embodiment (Organic EL Device)

If the organic EL device is required to have a wider viewing-angle range, in some cases, flatness over a broad band in the spectroscopic transmittance curve of the interference filter may be necessary. In such cases, the center wavelengths of interferences caused by the third light reflection boundary face 19 and the fourth light reflection boundary face 20 need to be separated away from each other. If the center wavelengths of interferences caused by the third light reflection boundary face 19 and the fourth light reflection boundary face 20 are separated away from each other by too a large difference, however, the flatness of the peak of the spectroscopic transmittance curve for the interference filter is lost so that it becomes difficult to sustain the viewing-angle characteristic. In order to solve this problem, in addition to the third light reflection boundary face 19 and the fourth light reflection boundary face 20 which are included in the organic EL device according to the first embodiment, there is newly provided a fifth light reflection boundary face in accordance with a third embodiment which is capable of improving the viewing-angle characteristic.

Figure 10:
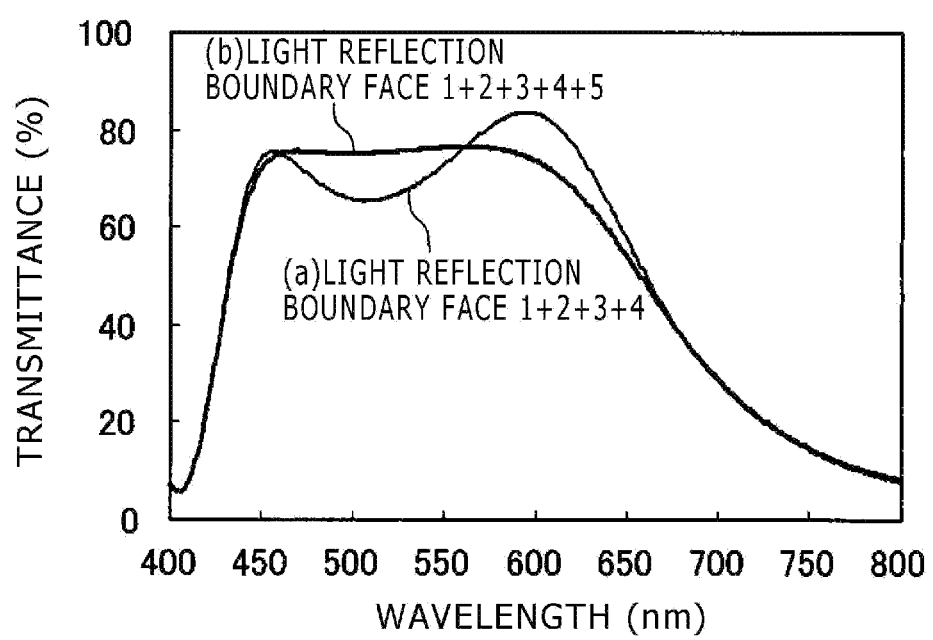
FIG. 10 is a diagram roughly showing a spectroscopic transmittance curve of a synthesized interference filter due to the first, second, third and fourth light reflection boundary faces and a spectroscopic transmittance curve of a synthesized interference filter due to the first, second, third, fourth and fifth light reflection boundary faces in an organic EL device according to a third embodiment.

For the fifth light reflection boundary face, there is a mutually strengthening condition in a range of $\lambda1\pm15$ nm where notation $\lambda1$ denotes the center wavelength of the light emission spectrum of the light emitting layer 13*a*. A curve (a) shown in FIG. 10 is a spectroscopic transmittance curve of a synthesized interference filter due to the first light reflection boundary face 17, the second light reflection boundary face 18, the third light reflection boundary face 19 and the fourth light reflection boundary face 20 which are included in the organic EL device according to the first embodiment not having the fifth light reflection boundary face. In this case, the central portion of the spectroscopic transmittance curve is inadvertently dented due to a broad band obtained by separating the interference wavelengths $\lambda13$ and $\lambda14$ from each other by a difference equal to or greater than 50 nm. In addition, for larger viewing angles, a luminance change exhibiting unevenness is generated.

On the other hand, a curve (b) shown in FIG. 10 is a spectroscopic transmittance curve of a synthesized interference filter due to the first light reflection boundary face 17, the second light reflection boundary face 18, the third light reflection boundary face 19, the fourth light reflection boundary face 20 and the fifth light reflection boundary face which are included in the organic EL device according to the third embodiment. By setting the fifth light reflection boundary face under a mutually strengthening condition for the center wavelength $\lambda1$ of the light emission spectrum of the light emitting layer 13*a*, as is obvious from the curve (b), it is possible to make the peak portion of the spectroscopic transmittance curve of the interference filter flat over a broad wavelength band.

Figure 11:
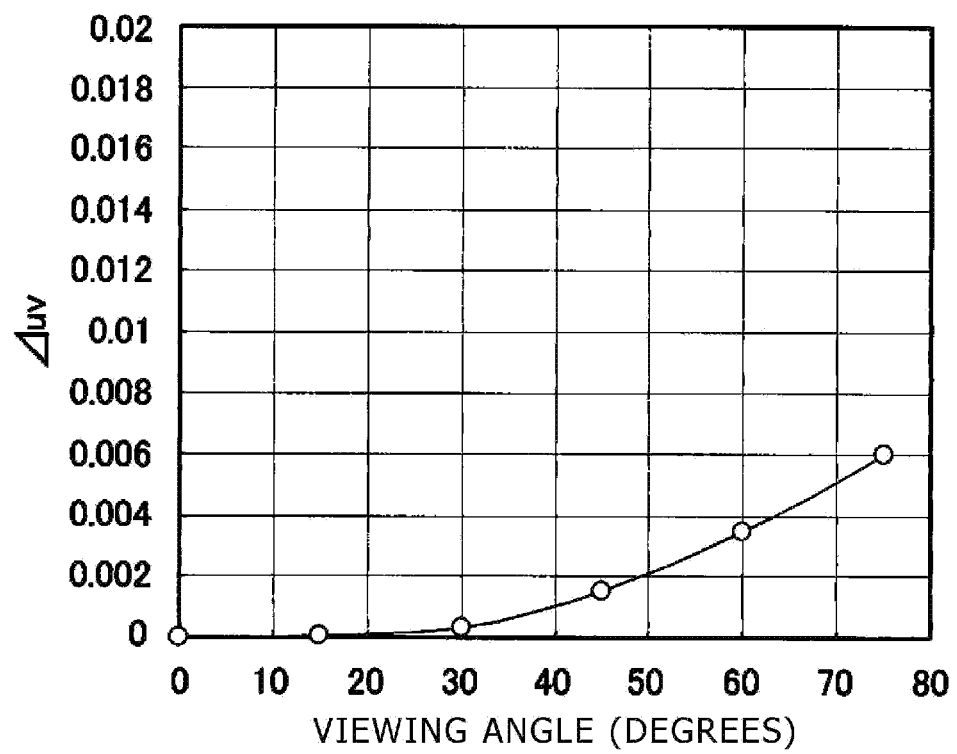
FIG. 11 is a diagram roughly showing a viewing-angle characteristic of the chromaticity of the organic EL device according to the third embodiment.
Figure 12:
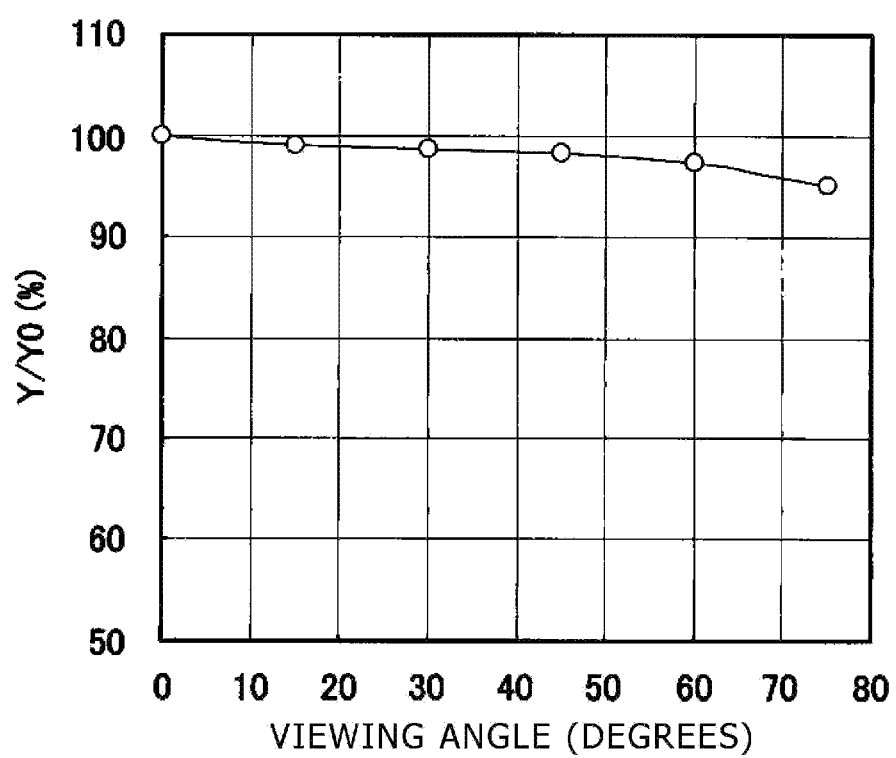
FIG. 12 is a diagram roughly showing a viewing-angle characteristic of the luminance of the organic EL device according to the third embodiment.

FIG. 11 is a diagram roughly showing a viewing-angle characteristic of the chromaticity of the organic EL device according to the third embodiment including the fifth light reflection boundary face whereas FIG. 12 is a diagram roughly showing a viewing-angle characteristic of the luminance of the organic EL device according to the third embodiment. As is obvious from FIGS. 11 and 12, the organic EL device according to the third embodiment is capable of further improving the viewing-angle characteristics of the chromaticity and the luminance in comparison with the organic EL device according to the first embodiment.

The third embodiment offers the same merits as the first embodiment. In addition, it is also possible to broaden the wavelength bands of the reverse-phase interference conditions expressed by Expressions (4) and (5). Thus, the third embodiment also has a merit that the viewing-angle characteristic of the luminance of the organic EL device and the viewing-angle characteristics of the chromaticity of the device can be further improved.

First Typical Implementation

A first typical implementation is an implementation for the first embodiment.

Figure 13:
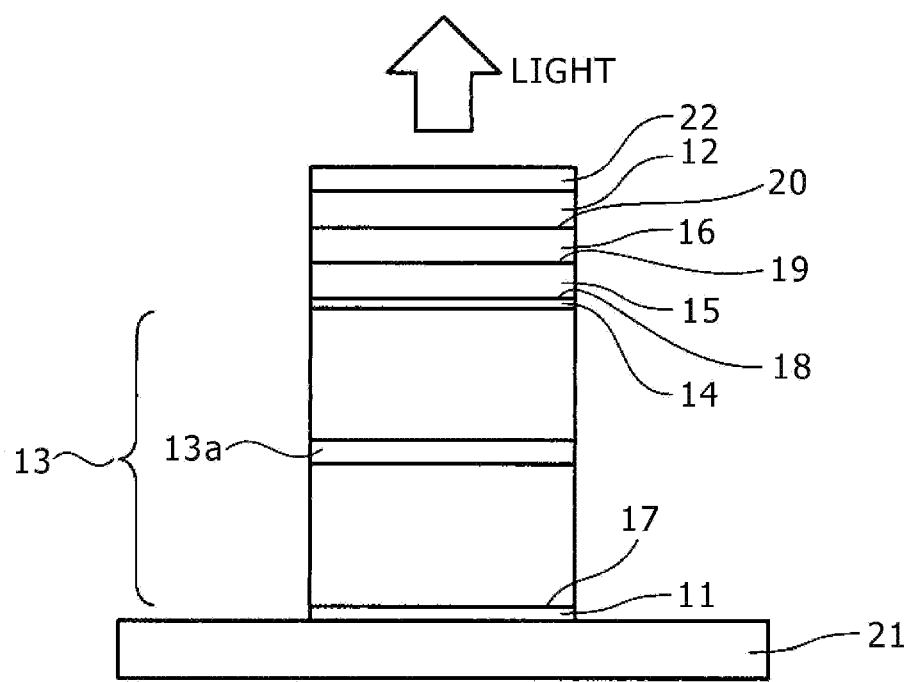
FIG. 13 is a cross-sectional diagram showing an upper-surface light-emission organic EL device according to a first typical implementation.

FIG. 13 is a cross-sectional diagram showing an organic EL device according to the first typical implementation. The upper-surface light-emission organic EL device is an organic EL device of the upper-surface light-emission type. As shown in FIG. 13, the organic EL device is constructed by creating a stack on a substrate 21 serving as the lowest layer. The stack is formed by sequentially creating a first electrode 11, an organic layer 13, a metallic film 14, a transparent layer 15, a transparent layer 16 and a second electrode 12 in the upward direction in order. Then, a passivation film 22 is provided on the second electrode 12. The organic layer 13 includes a light emitting layer 13a.

The substrate 21 is typically a transparent glass substrate or a semiconductor substrate such as a silicon substrate. The substrate 21 can also be configured as a flexible substrate.

The first electrode 11 is used to serve as an anode also functioning as a light reflection layer. The first electrode 11 is made from typically a light reflection material such as Al (aluminum), an aluminum alloy, Pt (platinum), Au (gold), Cr (chrome) or W (tungsten). It is desirable to set the thickness of the first electrode 11 at a value in a range of 100 nm to 300 nm. The first electrode 11 can be a transparent electrode. In this case, since a first light reflection boundary face 17 is to be created between the first electrode 11 and the substrate 21, it is desirable to make the first electrode 11 to serve as a light reflection layer from a light reflection material such as Pt, Au, Cr or W.

The organic layer 13 has a structure constructed by sequentially creating a hole injection layer, a hole transporting layer, the light emitting layer 13a, an electron transporting layer and an electron injection layer in order in the upward direction to form a stack. The hole injection layer is configured from typically the HAT (Hexa Aza Triphenylene). The hole transporting layer is configured from typically α-NPD[N,N'-di(1-naphtyl)-N,N'-diphenyl-[1,1'-biphenyl]-4,4'-diamine]. The light emitting layer 13a is made from a light emitting material for emitting light having a red, green or blue color. As a light emitting material for emitting light having a red color, it is possible to make use of a material obtained by doping rubrene serving as a host material with a pyrromethene-boron complex. As a light emitting material for emitting light having a green color, it is possible to make use of Alq3 (tris(8-hydroxyquinolinato)aluminium complex). As a light emitting material for emitting light having a blue color, it is possible to make use of a material produced typically as follows. To put it concretely, as a host material, an ADN (9,10-di(2-naphthyl) anthracene) is evaporated in order to create a film having a thickness of 20 nm. At that time, the ADN is doped with diamino chrysene derivative used as a dopant material at a relative film thickness ratio of 5% so that this film can be used as a light emitting material for emitting light having a blue color. The electron transporting layer is configured from typically a BCP (2,9-dimethyl-4,7-diphenyl-1,10-phenanthroline) or the like. The electron injection layer is configured from typically LiF (lithium fluoride) or the like.

The thicknesses of layers composing the organic layer 13 are set at values described as follows. It is desirable to set the thickness of the hole injection layer at a value in a range of 1 to 20 nm, the thickness of the hole transporting layer at a value in a range of 15 to 100 nm, the thickness of the light emitting layer 13a at a value in a range of 5 to 50 nm and the thicknesses of the electron injection layer as well as the electron transporting layer at a value in a range of 15 to 200 nm. The thicknesses of the organic layer 13 and the layers composing the organic layer 13 are set at such values that the optical film thicknesses allow the operations described above to be carried out.

A second light reflection boundary face 18 is created as a result of creation of the metallic film 14 on the organic layer 13. On the other hand, a third light reflection boundary face 19 is created by making use of a difference in refractive index between the transparent layer 15 and the transparent layer 16. By the same token, a fourth light reflection boundary face 20 is created by making use of a difference in refractive index between the transparent layer 16 and the second electrode 12. Each of the transparent layer 15 and the transparent layer 16 does not have to be a single-layer layer. That is to say, each of the transparent layer 15 and the transparent layer 16 can also be a stack constructed from two or more transparent layers having refractive indexes different from each other in accordance with the required flat wavelength band and the required viewing-angle characteristic.

The second electrode 12 for fetching the light emitted by the light emitting layer 13a is configured from the ITO and/or an oxide which are generally used as a material used for making a transparent electrode. Typical examples of such an oxide are the indium oxide and the zinc oxide. The second electrode 12 functions as a cathode. The thickness of the second electrode 12 has a value in a typical range of 30 to 3,000 nm.

The passivation film 22 is configured from a transparent derivative. The transparent derivative used for making the passivation film 22 is not necessarily required to have a refractive index of about the same order as the refractive index of the material used for making the second electrode 12. If the second electrode 12 is used also as the transparent layer 16, a boundary face is created by making use of a difference in refractive index between the second electrode 12 and the passivation film 22. In this case, it is possible to make use of the boundary face created in this way as the fourth light reflection boundary face 20. Typical examples of the transparent derivative are $SiO_2$ (silicon dioxide) and SiN (silicon nitride). The thickness of the passivation film 22 has a value in a typical range of 500 to 10,000 nm.

The metallic film 14 is made typically from a metallic material such as Mg (magnesium), Ag (silver) or any of their alloys. The thickness of the metallic film 14 is properly set at a value equal to or greater than 5 nm. By making use of the metallic film 14 as a light reflection layer, it is possible to produce an amplification effect having a strength greater than that of an ordinary interference. In addition, the second light reflection boundary face 18 created by this metallic film 14 provides both a broad wavelength band and a high transmittance.

Second Typical Implementation

A second typical implementation is another implementation for the first embodiment.

Figure 14:
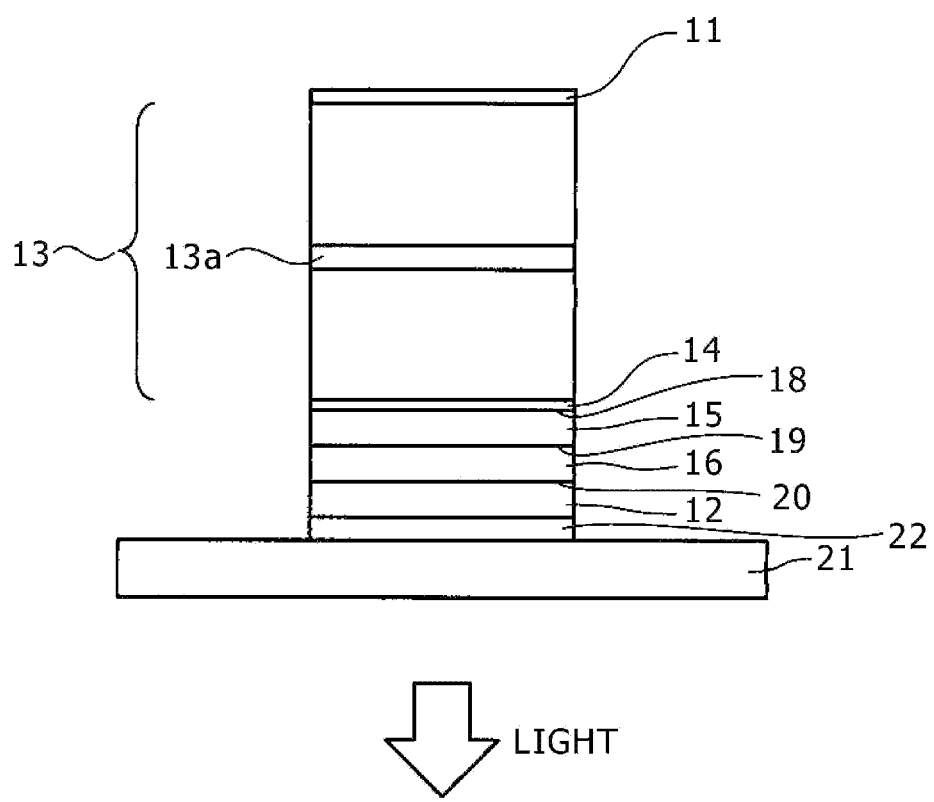
FIG. 14 is a cross-sectional diagram showing a lower-surface light-emission organic EL device according to a second typical implementation.

FIG. 14 is a cross-sectional diagram showing an organic EL device according to the second typical implementation. The organic EL device is an organic EL device of the lower-surface light-emission type. As shown in FIG. 14, the organic EL device is constructed by creating a stack on a substrate 21 serving as the lowest layer. The stack is formed by sequentially creating a passivation film 22, a second electrode 12, a transparent layer 16, a transparent layer 15, a metallic film 14, an organic layer 13 and a first electrode 11 in order in the upward direction. In this case, light radiated from the second electrode 12 passes through the substrate 21 and is fetched in the outside of the organic EL illumination apparatus. The rest of the second typical implementation is identical with the first typical implementation.

4. Fourth Embodiment (Organic EL Illumination Apparatus)

Figure 15:
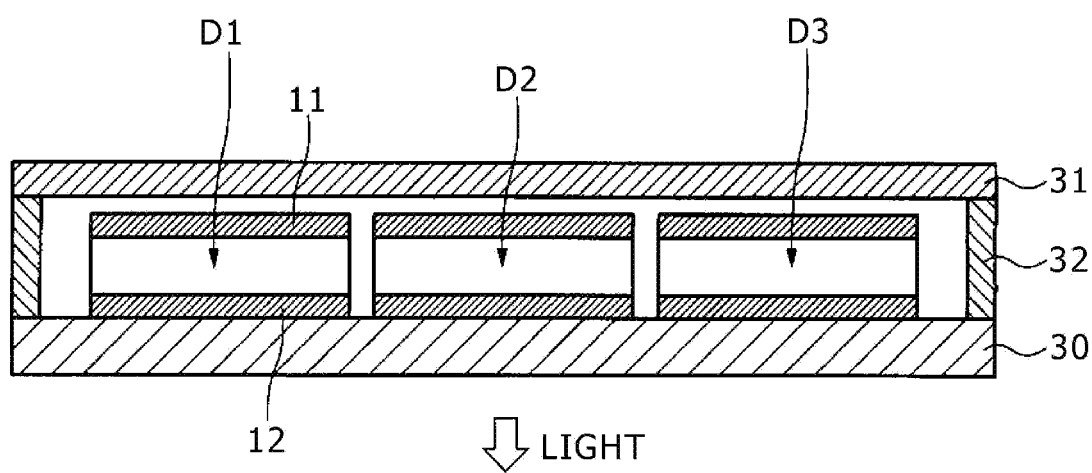
FIG. 15 is a cross-sectional diagram showing an organic EL illumination apparatus according to a fourth embodiment.

FIG. 15 is a cross-sectional diagram showing an organic EL illumination apparatus according to a fourth embodiment. As shown in FIG. 15, in this organic EL illumination apparatus, a first organic EL device D1, a second organic EL device D2 and a third organic EL device D3 are mounted on a transparent substrate 30. Each of the first organic EL device D1, the second organic EL device D2 and the third organic EL device D3 is an organic EL device according to any one of the first to third embodiments. In this configuration, each of the first organic EL device D1, the second organic EL device D2 and the third organic EL device D3 is oriented so that the second electrode 12 is positioned on the lower side to be exposed to the substrate 30. Thus, light radiated from the second electrode 12 passes through the substrate 30 and is fetched in the outside of the organic EL illumination apparatus.

A sealing substrate 31 is provided above the substrate 30 to face the substrate 30 by sandwiching the first organic EL device D1, the second organic EL device D2 and the third organic EL device D3 between the substrate 30 and the sealing substrate 31. The peripheries of the substrate 30 and the sealing substrate 31 are sealed by a sealing material 32.

The top view of this organic EL illumination apparatus can be selected as necessary. Typically, however, the top view of this organic EL illumination apparatus is square or rectangular. FIG. 15 shows only a set including the first organic EL device D1, the second organic EL device D2 and the third organic EL device D3. As necessary, however, a plurality of such sets may be mounted on the substrate 30 in accordance with a desired layout. Details of configurations of other components employed in the organic EL illumination apparatus as components other than the first organic EL device D1, the second organic EL device D2 and the third organic EL device D3 are identical with those of the generally known organic EL illumination apparatus. In addition, configurations other than the configurations of the other components are also identical with those of the generally known organic EL illumination apparatus.

The fourth embodiment makes use of the first organic EL device D1, the second organic EL device D2 and the third organic EL device D3 which are each an organic EL device according to any one of the first to third embodiments. Thus, it is possible to implement the organic EL illumination apparatus as a planar light source having little viewing-angle dependence and a good light distribution characteristic. In other words, it is thus possible to implement a planar light source which has extremely small strength and color changes caused by the illumination direction and has a good light distribution characteristic. In addition, by designing the light emitting layer 13a, the color of light emitted by each of the first organic EL device D1, the second organic EL device D2 and the third organic EL device D3 can be selected so that it is possible to obtain emitted light having a variety of colors in addition to emitted light having the white color. Thus, an organic EL illumination apparatus having a good color rendering characteristic can be implemented. In addition, the organic EL illumination apparatus can be manufactured with ease with a high degree of productivity.

5. Fifth Embodiment (Organic EL Display Apparatus)

Figure 16:
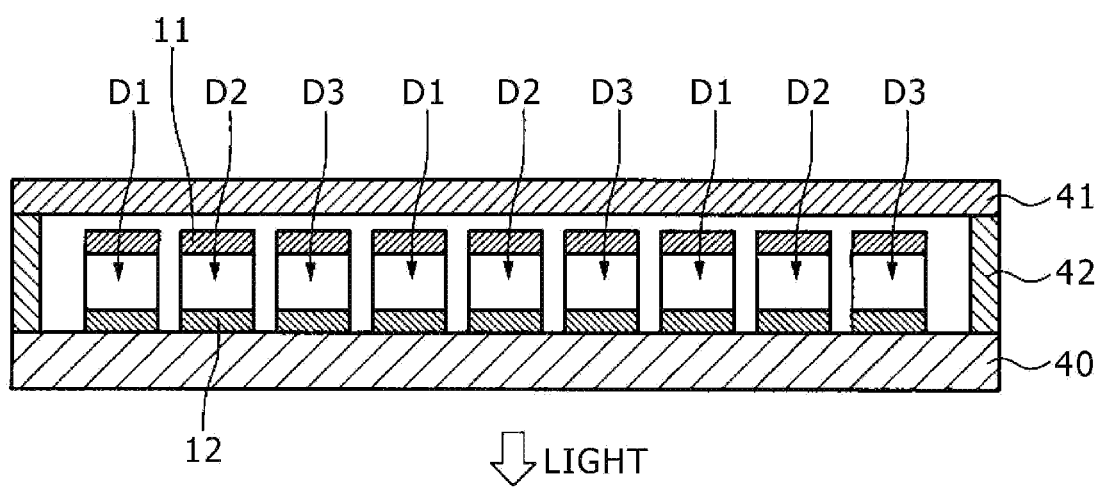
FIG. 16 is a cross-sectional diagram showing an organic EL display apparatus according to a fifth embodiment.

FIG. 16 is a cross-sectional diagram showing an organic EL display apparatus according to a fifth embodiment. The organic EL display apparatus has an active matrix type.

As shown in FIG. 16, in this organic EL display apparatus, a driving substrate 40 and a sealing substrate 41 are provided to face each other. The peripheries of the driving substrate 40 and the sealing substrate 41 are sealed by a sealing material 42. On typically a glass transparent substrate in the driving substrate 40, pixels are laid out to form a two-dimensional array. Each of the pixels includes a first organic EL device D1, a second organic EL device D2 and a third organic EL device D3 which are each an organic EL device according to any one of the first to third embodiments. On the driving substrate 40, a thin-film transistor is created for every pixel to serve as an active device for driving the pixel. In addition, scan lines each used for driving the thin-film transistor provided for a pixel, current supply lines and data lines are further provided, being oriented in the vertical and horizontal directions. Each thin-film transistor provided for a pixel receives a display signal generated for the pixel. The display signal drives the pixel so that an image is displayed on the organic EL display apparatus. Details of configurations of other components employed in the organic EL display apparatus as components other than the first organic EL device D1, the second organic EL device D2 and the third organic EL device D3 are identical with those of the generally known organic EL display apparatus. In addition, configurations other than the configurations of the other components are also identical with those of the generally known organic EL display apparatus.

This organic EL display apparatus can be used not only as an organic EL display apparatus for the black/white color, but also as a color organic EL display apparatus. If this organic EL display apparatus is used as a color organic EL display apparatus, RGB color filters are provided on a side close to the driving substrate 40. To put it concretely, the RGB color filters are provided between the driving substrate 40 and the second electrodes 12 of the first organic EL device D1, the second organic EL device D2 and the third organic EL device D3.

The fifth embodiment makes use of the first organic EL device D1, the second organic EL device D2 and the third organic EL device D3 which are each an organic EL device according to any one of the first to third embodiments. Thus, it is possible to implement an organic EL display apparatus capable of displaying an image which has extremely small illumination and color-phase changes caused by the viewing angle and has a high quality. In addition, the organic EL display apparatus can be manufactured with ease with a high degree of productivity.

Embodiments and typical implementations have been described so far in concrete terms. However, realizations of the present technology are by no means limited to the embodiments and the typical implementations. That is to say, the embodiments and the typical implementations can be further changed to further realize the present technology.

For example, the embodiments and the typical implementations make use of numerical values, structures, configurations, shapes, materials and the like. However, the numerical values, the structures, the configurations, the shapes, the materials and the like are no more than typical ones. As necessary, the embodiments and the typical implementations may make use of other numerical values, other structures, other configurations, other shapes, other materials and the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:
1. A light emitting device comprising:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and
a second light reflection boundary face, a third light reflection boundary face and a fourth light reflection boundary face which are sequentially provided at positions separated away from each other in a direction from said first electrode to said second electrode on said side close to said second electrode, wherein
with notation L1 denoting an optical distance between said first light reflection boundary face and the luminescence center of said light emitting layer,
with notation L2 denoting an optical distance between said luminescence center and said second light reflection boundary face,
with notation L3 denoting an optical distance between said luminescence center and said third light reflection boundary face,
with notation L4 denoting an optical distance between said luminescence center and said fourth light reflection boundary face,
with notation $\lambda 1$ denoting the center wavelength of a light emission spectrum of said light emitting layer,
with notations n, m, m' and m" each denoting an integer,
with notations $\lambda 11$, $\lambda 12$, $\lambda 13$ and $\lambda 14$ each denoting an interference wavelength,
with the length unit nanometer taken as a unit of said wavelengths $\lambda 1$, $\lambda 11$, $\lambda 12$, $\lambda 13$ and $\lambda 14$,
with notation $\phi 1$ denoting a phase change observed when light having wavelengths is reflected by said first light reflection boundary face,
with notation $\phi 2$ denoting a phase change observed when light having wavelengths is reflected by said second light reflection boundary face,
with notation $\phi 3$ denoting a phase change observed when light having wavelengths is reflected by said third light reflection boundary face, and
with notation $\phi 4$ denoting a phase change observed when light having wavelengths is reflected by said fourth light reflection boundary face,
said optical distances L1, L2, L3 and L4 satisfy all Expressions (1) to (8) given as follows:

$$\text{where } n \geq 0, 2L1/\lambda 11 + \phi 1/2\pi = n \quad (1)$$

$$\lambda 1 - 150 < \lambda 11 < \lambda 1 + 80 \quad (2)$$

$$2L2/\lambda 12 + \phi 2/2\pi = m \quad (3)$$

$$2L3/\lambda 13 + \phi 3/2\pi = m' + 1/2 \quad (4)$$

$$2L4/\lambda 14 + \phi 4/2\pi = m'' + 1/2 \quad (5)$$

$$\lambda 1 - 80 < \lambda 12 < \lambda 1 + 80 \quad (6)$$

$$\lambda 1 - 150 < \lambda 13 < \lambda 1 + 150 \quad (7)$$

$$\lambda 1 - 150 < \lambda 14 < \lambda 1 + 150 \quad (8).$$

2. The light emitting device according to claim 1 wherein the peak of a spectroscopic transmittance curve of an interference filter in said light emitting device is all but flat in the visible-light domain or the gradients of bands of all light emission colors are approximately equal to each other.

3. The light emitting device according to claim 2, wherein said light emitting device capable of making a luminance decrease from a luminance for a viewing angle of 0 degrees to a luminance for a viewing angle of 45 degrees equal to or smaller than 30% of said luminance for said viewing angle of 0 degrees and setting a chromaticity shift $\Delta uv$ at a value satisfying the relation $\Delta uv \leq 0.015$.

4. The light emitting device according to claim 3, wherein said second light reflection boundary face is configured by making use of a metallic thin film having a non-zero extinction coefficient and a thickness of at least 5 nm whereas said third light reflection boundary face and said fourth light reflection boundary face are each configured by making use of a refractive index.

5. The light emitting device according to claim 4, wherein said light emitting device further having a fifth light reflection boundary face for adjusting the flatness of said peak of said spectroscopic transmittance curve of said interference filter in said light emitting device.

6. The light emitting device according to claim 5, wherein at least one of said second light reflection boundary face, said third light reflection boundary face, said fourth light reflection boundary face and said fifth light reflection boundary face is divided into a plurality of light reflection boundary faces.

7. The light emitting device according to claim 6, wherein the equations n=0 and m=0 hold true.

8. The light emitting device according to claim 1, wherein said first electrode, said organic layer and said second electrode are created sequentially to form a stack on a substrate.

9. The light emitting device according to claim 8, wherein the outer side of the last light reflection boundary face provided on said side close to said second electrode is created from a transparent electrode layer, a transparent insulation layer, a resin layer, a glass layer or an air layer which has a thickness of at least 1 μm.

10. The light emitting device according to claim 1, wherein said second electrode, said organic layer and said first electrode are created sequentially to form a stack on a substrate.

11. The light emitting device according to claim 10, wherein the outer side of the last light reflection boundary face provided on said side close to said second electrode is created from a transparent electrode layer, a transparent insulation layer, a resin layer, a glass layer or an air layer which has a thickness of at least 1 μm.

12. An illumination apparatus employing a plurality of light emitting devices which are used for emitting light having plain colors different from each other and each comprise:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and
a second light reflection boundary face, a third light reflection boundary face and a fourth light reflection boundary face which are sequentially provided at positions separated away from each other in a direction from said first electrode to said second electrode on said side close to said second electrode,
wherein
with notation L1 denoting an optical distance between said first light reflection boundary face and the luminescence center of said light emitting layer,
with notation L2 denoting an optical distance between said luminescence center and said second light reflection boundary face,
with notation L3 denoting an optical distance between said luminescence center and said third light reflection boundary face,
with notation L4 denoting an optical distance between said luminescence center and said fourth light reflection boundary face,
with notation $\lambda 1$ denoting the center wavelength of a light emission spectrum of said light emitting layer,
with notations n, m, m' and m" each denoting an integer,
with notations $\lambda 11$, $\lambda 12$, $\lambda 13$ and $\lambda 14$ each denoting an interference wavelength,
with the length unit nanometer taken as a unit of said wavelengths $\lambda 1$, $\lambda 11$, $\lambda 12$, $\lambda 13$ and $\lambda 14$,
with notation $\phi 1$ denoting a phase change observed when light having wavelengths is reflected by said first light reflection boundary face,
with notation $\phi 2$ denoting a phase change observed when light having wavelengths is reflected by said second light reflection boundary face,
with notation $\phi 3$ denoting a phase change observed when light having wavelengths is reflected by said third light reflection boundary face, and
with notation $\phi 4$ denoting a phase change observed when light having wavelengths is reflected by said fourth light reflection boundary face,
said optical distances L1, L2, L3 and L4 satisfy all Expressions (1) to (8) given as follows:

$$\text{where } n \geq 0, 2L1/\lambda 11 + \phi 1/2\pi = n \tag{1}$$

$$\lambda 1 - 150 < \lambda 11 < \lambda 1 + 80 \tag{2}$$

$$2L2/\lambda 12 + \phi 2/2\pi = m \tag{3}$$

$$2L3/\lambda 13 + \phi 3/2\pi = m' + 1/2 \tag{4}$$

$$2L4/\lambda 14 + \phi 4/2\pi = m'' + 1/2 \tag{5}$$

$$\lambda 1 - 80 < \lambda 12 < \lambda 1 + 80 \tag{6}$$

$$\lambda 1 - 150 < \lambda 13 < \lambda 1 + 150 \tag{7}$$

$$\lambda 1 - 150 < \lambda 14 < \lambda 1 + 150 \tag{8}$$

13. A display apparatus employing a plurality of light emitting devices which are used for emitting light having plain colors different from each other and each comprise:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and
a second light reflection boundary face, a third light reflection boundary face and a fourth light reflection boundary face which are sequentially provided at positions separated away from each other in a direction from said first electrode to said second electrode on said side close to said second electrode,
wherein
with notation L1 denoting an optical distance between said first light reflection boundary face and the luminescence center of said light emitting layer,
with notation L2 denoting an optical distance between said luminescence center and said second light reflection boundary face,
with notation L3 denoting an optical distance between said luminescence center and said third light reflection boundary face,
with notation L4 denoting an optical distance between said luminescence center and said fourth light reflection boundary face,
with notation $\lambda 1$ denoting the center wavelength of a light emission spectrum of said light emitting layer,
with notations n, m, m' and m" each denoting an integer,
with notations $\lambda 11$, $\lambda 12$, $\lambda 13$ and $\lambda 14$ each denoting an interference wavelength,
with the length unit nanometer taken as a unit of said wavelengths $\lambda 1$, $\lambda 11$, $\lambda 12$, $\lambda 13$ and $\lambda 14$,
with notation $\phi 1$ denoting a phase change observed when light having wavelengths is reflected by said first light reflection boundary face,
with notation $\phi 2$ denoting a phase change observed when light having wavelengths is reflected by said second light reflection boundary face,
with notation $\phi 3$ denoting a phase change observed when light having wavelengths is reflected by said third light reflection boundary face, and
with notation $\phi 4$ denoting a phase change observed when light having wavelengths is reflected by said fourth light reflection boundary face,
said optical distances L1, L2, L3 and L4 satisfy all Expressions (1) to (8) given as follows:

$$\text{where } n \geq 0, 2L1/\lambda 11 + \phi 1/2\pi = n \tag{1}$$

$$\lambda 1 - 150 < \lambda 11 < \lambda 1 + 80 \tag{2}$$

$$2L2/\lambda 12 + \phi 2/2\pi = m \tag{3}$$

$$2L3/\lambda 13 + \phi 3/2\pi = m' + 1/2 \tag{4}$$

$$2L4/\lambda 14 + \phi 4/2\pi = m'' + 1/2 \tag{5}$$

$$\lambda 1 - 80 < \lambda 12 < \lambda 1 + 80 \tag{6}$$

$$\lambda 1 - 150 < \lambda 13 < \lambda 1 + 150 \tag{7}$$

$$\lambda 1 - 150 < \lambda 14 < \lambda 1 + 150 \tag{8}$$

14. The display apparatus according to claim 13, said display apparatus further comprising:
a driving substrate in which active devices each used for supplying a display signal for every display pixel to one of said light emitting devices are provided; and
a sealing substrate provided to face said driving substrate, wherein said light emitting devices are provided between said driving substrate and said sealing substrate.

15. The display apparatus according to claim 14 wherein:
one of the driving substrate and the sealing substrate is a substrate on said side close to said second electrode of each of said light emitting devices; and
a color filter is provided on said substrate on said side close to said second electrode to serve as a filter for transmitting light radiated from said side close to said second electrode to said substrate on said side close to said second electrode.

16. A light emitting device comprising:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and
a second light reflection boundary face and a third light reflection boundary face which are sequentially provided at positions separated away from each other in a direction from said first electrode to said second electrode on said side close to said second electrode,
wherein
with notation L1 denoting an optical distance between said first light reflection boundary face and the luminescence center of said light emitting layer,
with notation L2 denoting an optical distance between said luminescence center and said second light reflection boundary face,
with notation L3 denoting an optical distance between said luminescence center and said third light reflection boundary face,
with notation $\lambda 1$ denoting the center wavelength of a light emission spectrum of said light emitting layer,
with notations n, m and m' each denoting an integer,
with notations $\lambda 11$, $\lambda 12$ and $\lambda 13$ each denoting an interference wavelength,
with the length unit nanometer taken as a unit of said wavelengths $\lambda 1$, $\lambda 11$, $\lambda 12$ and $\lambda 13$,
with notation $\phi 1$ denoting a phase change observed when light having wavelengths is reflected by said first light reflection boundary face,
with notation $\phi 2$ denoting a phase change observed when light having wavelengths is reflected by said second light reflection boundary face, and
with notation $\phi 3$ denoting a phase change observed when light having wavelengths is reflected by said third light reflection boundary face,
said optical distances L1, L2 and L3 satisfy all Expressions (9) to (14) given as follows:

$$\text{where } n \geq 0, \ 2L1/\lambda 11 + \phi 1/2\pi = n \quad (9)$$

$$\lambda 1 - 150 < \lambda 11 < \lambda 1 + 80 \quad (10)$$

$$2L2/\lambda 12 + \phi 2/2\pi = m \quad (11)$$

$$2L3/\lambda 13 + \phi 3/2\pi = m' + 1/2 \quad (12)$$

$$\lambda 1 - 80 < \lambda 12 < \lambda 1 + 80 \quad (13)$$

$$\lambda 1 - 150 < \lambda 13 < \lambda 1 + 150 \quad (14).$$

17. The light emitting device according to claim 16 wherein the peak of a spectroscopic transmittance curve of an interference filter in said light emitting device is all but flat in the visible-light domain or the gradients of bands of all light emission colors are approximately equal to each other.

18. The light emitting device according to claim 17, said light emitting device capable of making a luminance decrease from a luminance for a viewing angle of 0 degrees to a luminance for a viewing angle of 45 degrees equal to or smaller than 30% of said luminance for said viewing angle of 0 degrees and setting a chromaticity shift $\Delta uv$ at a value satisfying the relation $\Delta uv \leq 0.015$.

19. An illumination apparatus employing a plurality of light emitting devices which are used for emitting light having plain colors different from each other and each comprise:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and
a second light reflection boundary face and a third light reflection boundary face which are sequentially provided at positions separated away from each other in a direction from said first electrode to said second electrode on said side close to said second electrode,
wherein
with notation L1 denoting an optical distance between said first light reflection boundary face and the luminescence center of said light emitting layer,
with notation L2 denoting an optical distance between said luminescence center and said second light reflection boundary face,
with notation L3 denoting an optical distance between said luminescence center and said third light reflection boundary face,
with notation $\lambda 1$ denoting the center wavelength of a light emission spectrum of said light emitting layer,
with notations n, m and m' each denoting an integer,
with notations $\lambda 11$, $\lambda 12$ and $\lambda 13$ each denoting an interference wavelength,
with the length unit nanometer taken as a unit of said wavelengths $\lambda 1$, $\lambda 11$, $\lambda 12$ and $\lambda 13$,
with notation $\phi 1$ denoting a phase change observed when light having wavelengths is reflected by said first light reflection boundary face,
with notation $\phi 2$ denoting a phase change observed when light having wavelengths is reflected by said second light reflection boundary face, and
with notation $\phi 3$ denoting a phase change observed when light having wavelengths is reflected by said third light reflection boundary face,
said optical distances L1, L2 and L3 satisfy all Expressions (9) to (14) given as follows:

$$\text{where } n \geq 0, \ 2L1/\lambda 11 + \phi 1/2\pi = n \quad (9)$$

$$\lambda 1 - 150 < \lambda 11 < \lambda 1 + 80 \quad (10)$$

$$2L2/\lambda 12 + \phi 2/2\pi = m \quad (11)$$

$$2L3/\lambda 13 + \phi 3/2\pi = m' + 1/2 \quad (12)$$

$$\lambda 1 - 80 < \lambda 12 < \lambda 1 + 80 \quad (13)$$

$$\lambda 1 - 150 < \lambda 13 < \lambda 1 + 150 \quad (14).$$

20. A display apparatus employing a plurality of light emitting devices which are used for emitting light having plain colors different from each other and each comprise:
an organic layer sandwiched between a first electrode and a second electrode to serve as an organic layer including a light emitting layer for emitting monochromatic light at one location;
a first light reflection boundary face provided on a side close to said first electrode to serve as a boundary face for reflecting light emitted from said light emitting layer so as to radiate said reflected light from a side close to said second electrode; and a second light reflection boundary face and a third light reflection boundary face which are sequentially provided at positions separated away from each other in a direction from said first electrode to said second electrode on said side close to said second electrode, wherein with notation L1 denoting an optical distance between said first light reflection boundary face and the luminescence center of said light emitting layer, with notation L2 denoting an optical distance between said luminescence center and said second light reflection boundary face, with notation L3 denoting an optical distance between said luminescence center and said third light reflection boundary face, with notation $\lambda 1$ denoting the center wavelength of a light emission spectrum of said light emitting layer, with notations n, m and m' each denoting an integer, with notations $\lambda 11$, $\lambda 12$ and $\lambda 13$ each denoting an interference wavelength, with the length unit nanometer taken as a unit of said wavelengths $\lambda 1$, $\lambda 11$, $\lambda 12$ and $\lambda 13$, with notation $\phi 1$ denoting a phase change observed when light having wavelengths is reflected by said first light reflection boundary face, with notation $\phi 2$ denoting a phase change observed when light having wavelengths is reflected by said second light reflection boundary face, and with notation $\phi 3$ denoting a phase change observed when light having wavelengths is reflected by said third light reflection boundary face, said optical distances L1, L2 and L3 satisfy all Expressions (9) to (14) given as follows:

$$\text{where } n \geq 0,\ 2L1/\lambda 11 + \phi 1/2\pi = n \tag{9}$$

$$\lambda 1 - 150 < \lambda 11 < \lambda 1 + 80 \tag{10}$$

$$2L2/\lambda 12 + \phi 2/2\pi = m \tag{11}$$

$$2L3/\lambda 13 + \phi 3/2\pi = m' + 1/2 \tag{12}$$

$$\lambda 1 - 80 < \lambda 12 < \lambda 1 + 80 \tag{13}$$

$$\lambda 1 - 150 < \lambda 13 < \lambda 1 + 150 \tag{14}.$$

* * * * *